United States Patent
Yoshioka et al.

(10) Patent No.: US 9,506,162 B2
(45) Date of Patent: Nov. 29, 2016

(54) ELECTROCHEMICAL DEPOSITION METHOD

(71) Applicant: EBARA CORPORATION, Tokyo (JP)

(72) Inventors: Junichiro Yoshioka, Tokyo (JP); Kuniaki Horie, Tokyo (JP); Yugang Guo, Tokyo (JP); Satoshi Morikami, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 15/180,448

(22) Filed: Jun. 13, 2016

(65) Prior Publication Data

US 2016/0319455 A1   Nov. 3, 2016

Related U.S. Application Data

(62) Division of application No. 14/565,841, filed on Dec. 10, 2014, now Pat. No. 9,388,505, which is a division of application No. 13/684,902, filed on Nov. 26, 2012, now Pat. No. 8,936,705, which is a division of application No. 13/017,294, filed on Jan. 31, 2011, now Pat. No. 8,337,680, which is a division of application No. 12/585,141, filed on Sep. 4, 2009, now Pat. No. 7,901,551, which is a division of application No. 10/482,476, filed as application No. PCT/JP03/07855 on Jun. 20, 2003, now Pat. No. 7,601,248.

(30) Foreign Application Priority Data

Jul. 22, 2002 (JP) .................................. 2002-213208
Jul. 22, 2002 (JP) .................................. 2002-213209

(51) Int. Cl.
*C25D 17/00* (2006.01)
*C25D 7/12* (2006.01)
*H01L 21/687* (2006.01)

(Continued)

(52) U.S. Cl.
CPC ............... *C25D 17/001* (2013.01); *C25D 7/12* (2013.01); *C25D 17/004* (2013.01); *C25D 17/005* (2013.01); *H01L 21/6838* (2013.01); *H01L 21/68764* (2013.01); *C25D 7/123* (2013.01); *H01L 21/2885* (2013.01); *H01L 21/76879* (2013.01); *H01L 24/11* (2013.01); *H01L 24/742* (2013.01); *H01L 2224/11462* (2013.01); *H01L 2224/13139* (2013.01); *H01L 2224/13144* (2013.01); *H01L 2224/13147* (2013.01); *H01L 2224/13155* (2013.01)

(58) Field of Classification Search
USPC ..................................................... 204/297.01
See application file for complete search history.

(56) References Cited

U.S. PATENT DOCUMENTS 4,206,632 A   6/1980   Suzuki
4,697,058 A   9/1987   Mueller
(Continued)

FOREIGN PATENT DOCUMENTS

EP   0 650 181   4/1995
JP   4-286121   10/1992
(Continued)

*Primary Examiner* — Harry D Wilkins, III
(74) *Attorney, Agent, or Firm* — Wenderoth, Lind & Ponack, L.L.P.

(57) ABSTRACT

The present invention is to provide a substrate holder which can effect a more complete sealing with a sealing member and makes it possible to take a substrate out of the substrate holder easily and securely, and also a plating apparatus provided with the substrate holder. The substrate holder includes: a fixed holding member and a movable holding member for holding a substrate therebetween; a sealing member mounted to the fixed holding member or the movable holding member; and a suction pad for attracting a back surface of the substrate held between the fixed holding member and the movable holding member.

3 Claims, 23 Drawing Sheets

(51) Int. Cl.
*H01L 21/683* (2006.01)
*H01L 21/288* (2006.01)
*H01L 23/00* (2006.01)
*H01L 21/768* (2006.01)

(56) References Cited

U.S. PATENT DOCUMENTS

| | | | |
|---|---|---|---|
| 5,142,113 A | 8/1992 | Miyata | |
| 5,227,041 A * | 7/1993 | Brogden | C25D 7/12 204/297.05 |
| 5,324,410 A * | 6/1994 | Kummer | H01L 21/67075 204/297.05 |
| 5,518,257 A | 5/1996 | Breaker | |
| 5,853,559 A | 12/1998 | Tamaki et al. | |
| 5,925,226 A | 7/1999 | Hurwitt et al. | |
| 5,951,833 A | 9/1999 | Yamagata | |
| 6,139,712 A | 10/2000 | Patton et al. | |
| 6,202,655 B1 | 3/2001 | Yamagata | |
| 6,217,734 B1 | 4/2001 | Uzoh | |
| 6,241,591 B1 | 6/2001 | Jackson et al. | |
| 6,416,647 B1 | 7/2002 | Dordi | |
| 6,443,440 B1 * | 9/2002 | Moritz | H01J 37/32458 118/500 |
| 6,495,007 B2 | 12/2002 | Wang | |
| 6,527,926 B2 | 3/2003 | Wodoruff | |
| 6,569,302 B1 | 5/2003 | Steinrucke | |
| 6,613,214 B2 | 9/2003 | Dordi et al. | |
| 6,958,113 B2 | 10/2005 | Mizohata et al. | |
| 7,022,211 B2 | 4/2006 | Yoshioka et al. | |
| 7,402,227 B2 | 7/2008 | Yoshioka et al. | |
| 2001/0000396 A1 * | 4/2001 | Dordi | C25D 17/12 204/212 |
| 2002/0000372 A1 | 1/2002 | Pedersen et al. | |
| 2002/0029963 A1 | 3/2002 | Yoshioka et al. | |
| 2002/0130049 A1 * | 9/2002 | Chen | B23H 5/08 205/640 |

FOREIGN PATENT DOCUMENTS

| | | |
|---|---|---|
| JP | 6-117597 | 4/1994 |
| JP | 6-227654 | 8/1994 |
| JP | 06-310461 | 11/1994 |
| JP | 7-211724 | 8/1995 |
| JP | 9-59795 | 3/1997 |
| JP | 9-263944 | 10/1997 |
| JP | 10-226896 | 8/1998 |
| JP | 10-275798 | 10/1998 |
| JP | 11-200096 | 7/1999 |
| JP | 11-204459 | 7/1999 |
| JP | 2000-239898 | 9/2000 |
| JP | 2001-247999 | 9/2001 |
| JP | 2001-345373 | 12/2001 |
| JP | 2002-110768 | 4/2002 |
| WO | 99-54920 | 10/1999 |

* cited by examiner

F I G. 4
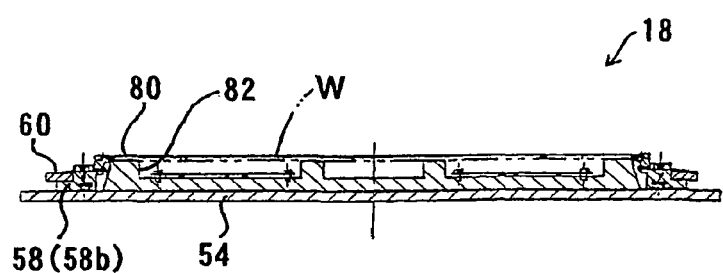

F I G. 1 1
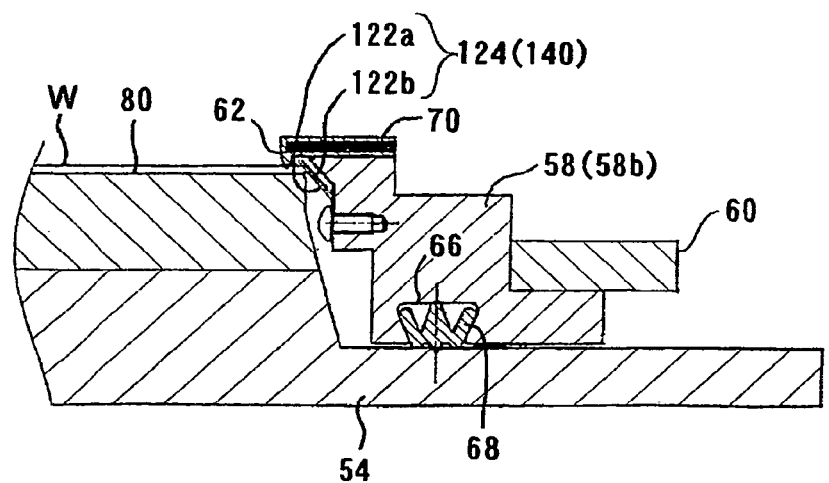
F I G. 1 2
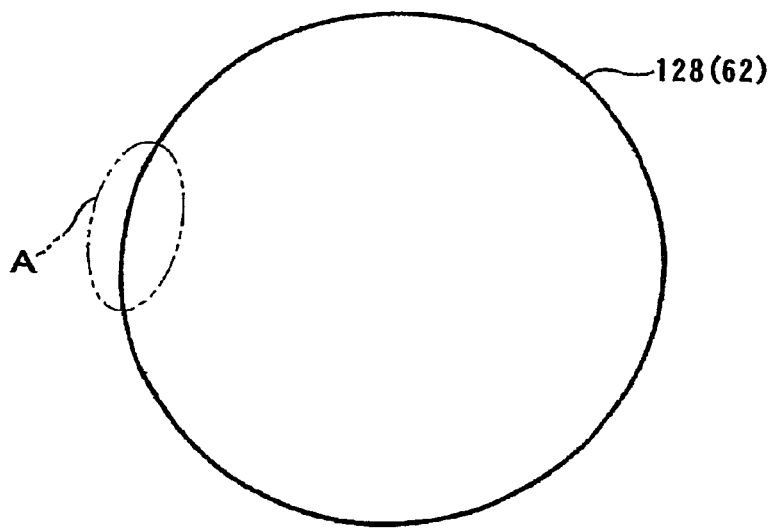

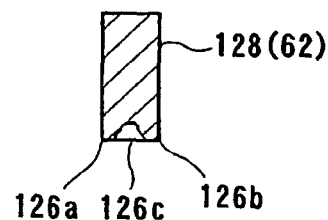
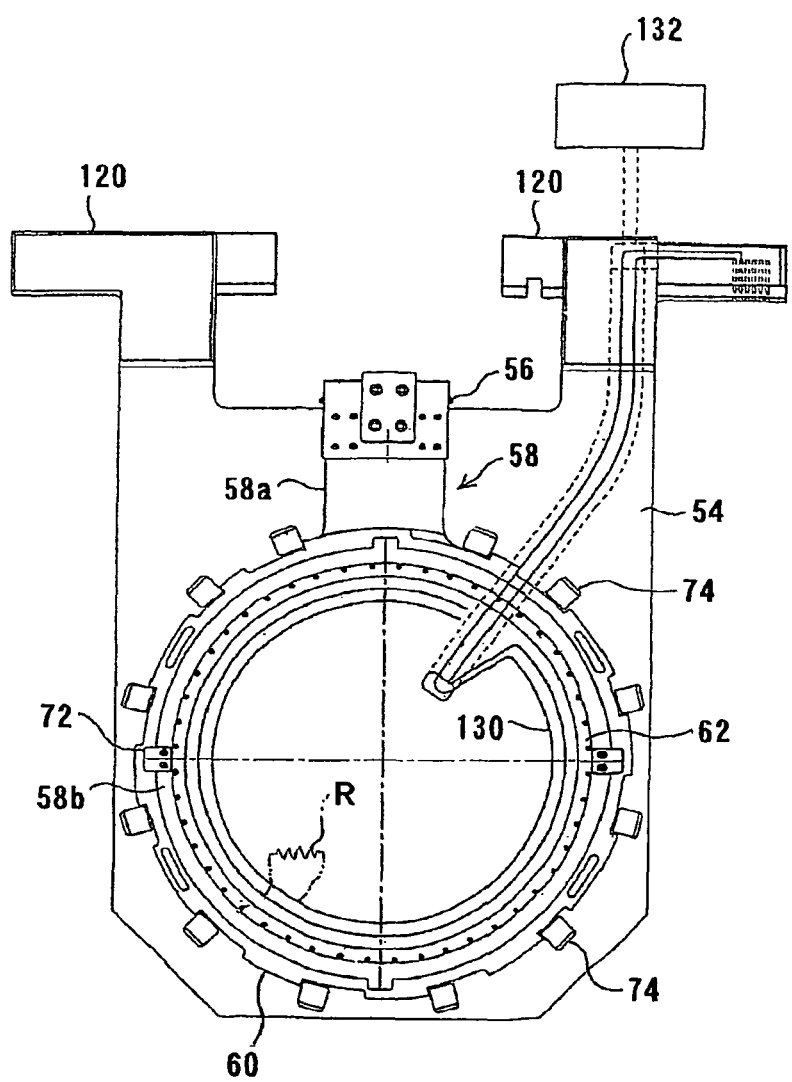

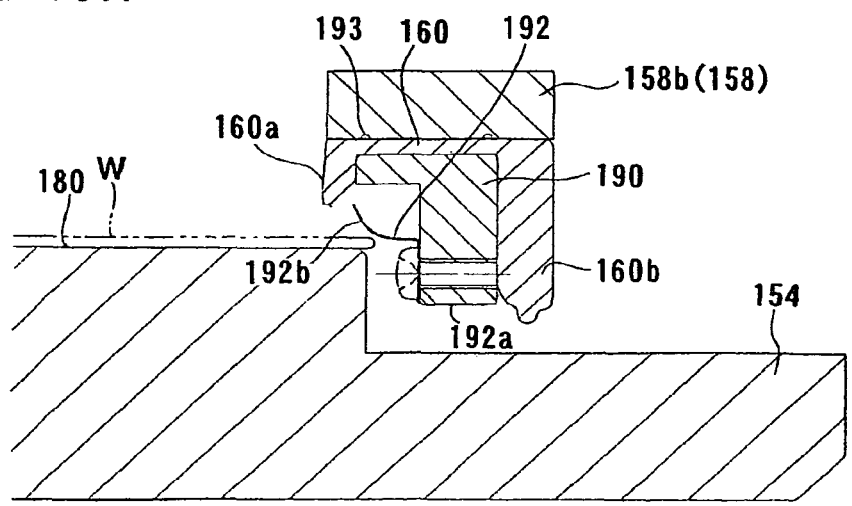
FIG. 23A
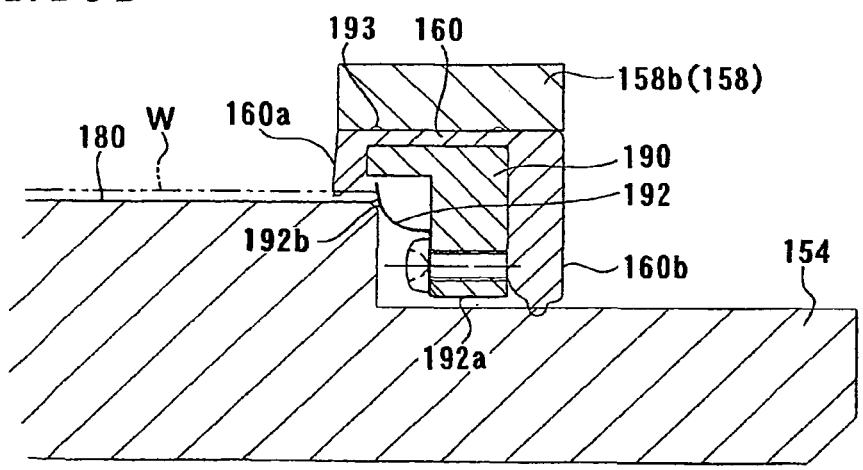
FIG. 23B

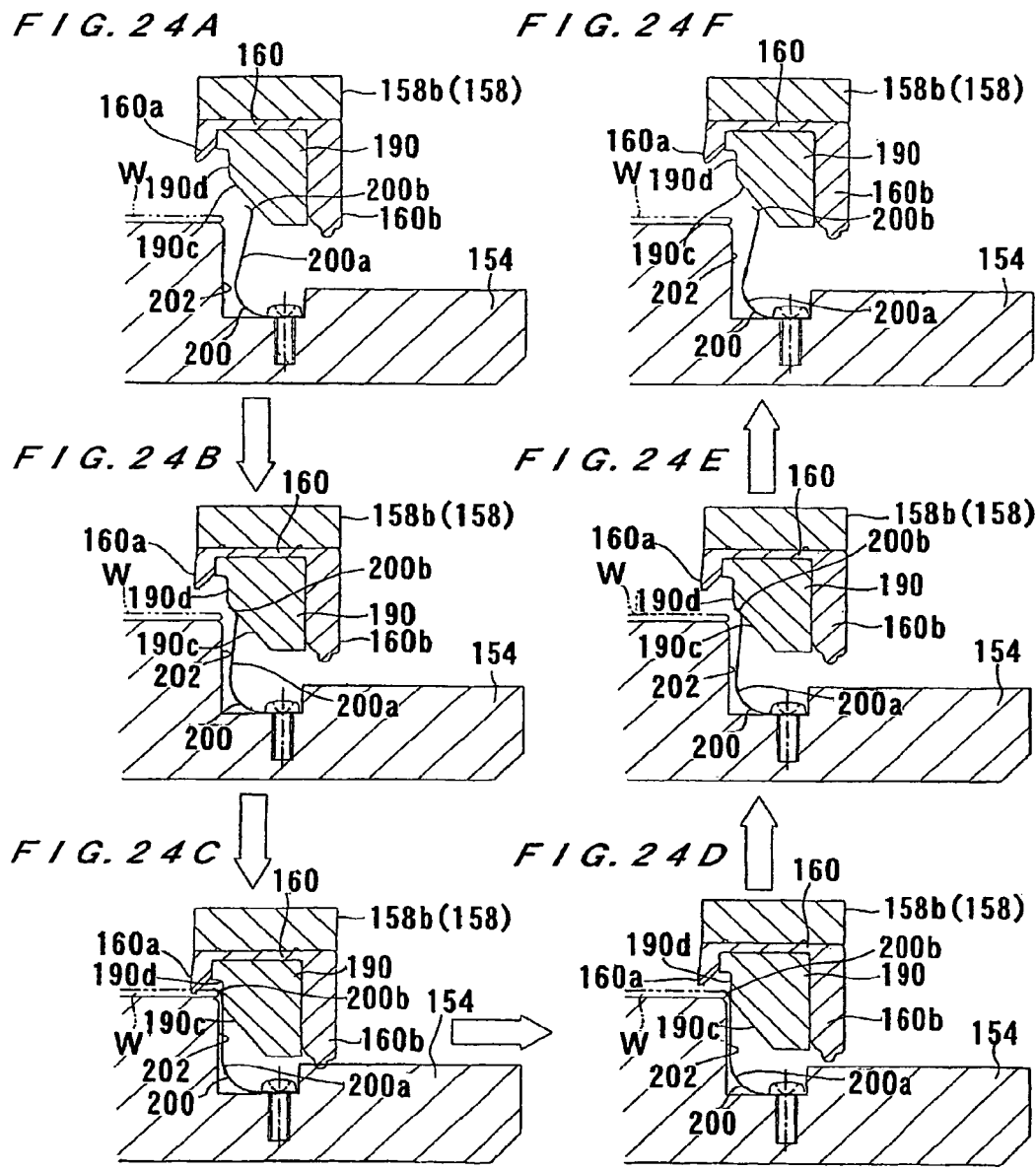

ELECTROCHEMICAL DEPOSITION METHOD

TECHNICAL FIELD

The present invention relates to a substrate holder for use in a plating apparatus for plating a to-be-plated surface of a substrate, especially a plating apparatus for forming a plated film in fine interconnect trenches or holes, or resist openings provided in a surface of a semiconductor wafer, or for forming bumps (protruding electrodes), which are to be electrically connected to electrodes, or the like, of a package, on a surface of a semiconductor wafer, and also to a plating apparatus provided with the substrate holder.

BACKGROUND ART

In tape automated bonding (TAB) or flip chip bonding, for example, it has been widely conducted to deposit gold, copper, solder, nickel or multi-layered materials thereof at prescribed areas (electrodes) on a surface of a semiconductor chip having interconnects, thereby forming protruding connecting electrodes (bumps). Such bumps electrically connect the semiconductor chip with package electrodes or TAB electrodes. There are various methods for forming these bumps, including an electroplating method, vapor deposition method, printing method, and ball bump method. The electroplating method has become in wide use due to its relatively stable performance and capability of forming fine connections, in view of a recent tendency to increasing number of I/O terminals on semiconductor chips and to finer pitch.

The electroplating method includes a spurting or cup method in which a substrate such as a semiconductor wafer is positioned horizontally with a processing surface to be plated facing downward and a plating solution is spurted from below; and a dipping method in which the substrate is placed vertically in a plating tank and immersed in a plating solution, while a plating solution is supplied from a bottom of the plating tank and is allowed to overflow the tank. According to the dipping method of electroplating, bubbles that can adversely affect quality of plating are easily removed and a footprint is small. The dipping method is therefore considered to be suited for bump plating in which holes to be filled by the plating are relatively large and which requires a fairly long plating time.

Conventional electroplating apparatuses, employing the dipping method, are provided with a substrate holder which detachably holds a substrate, such as a semiconductor wafer, with its end and back surfaces sealed while its front surface (to-be-plated surface) is exposed. Such conventional apparatuses perform plating of the surface of the substrate by dipping the substrate holder, together with the substrate held by it, in a plating solution, and have an advantage of easy release of gas bubbles.

Since a substrate holder with a substrate held is dipped in a plating solution, the substrate holder is required to securely seal a peripheral portion of the substrate so that the plating solution will not intrude into a back surface (non-plating surface) side. Accordingly, in a substrate holder which detachably holds a substrate between a pair of supports (holding members), for example, a sealing member is mounted to one support and the sealing member is brought into pressure contact with a peripheral portion of the substrate placed and held on the other support, thereby sealing a peripheral portion of the substrate.

With reference to such a conventional substrate holder, attempts have been made to avoid leakage of a plating solution or other liquid, as by optimization of a shape, fixing method, and the like of the sealing member, periodical (including per substrate) cleaning of the sealing member, periodical change of the sealing member, improvement of precision in pretreatments of a substrate (formation of a seed layer or a photo resist film), or minimization of error in setting of a substrate in the substrate holder as well as periodical realignment.

Due to deterioration of the sealing member, however, it is difficult to effect a complete sealing. Complete sealing is difficult especially in performing plating to embed a plated film into fine recesses, since a plating solution having a good permeability is generally used in such a plating so that the plating solution can easily and fully permeate into the fine recesses. On the other hand, it is also generally difficult to detect leakage of plating solution or other liquid. Once leakage of plating solution occurs, the plating solution, which has leaked into a substrate holder, adheres to a back surface of a substrate, and the plating solution adhering to the substrate will transfer to a substrate transport device, resulting in staining of the entire apparatus with the plating solution. In addition, leaked plating solution can corrode an electrical contact, thereby preventing feeding of electricity.

When performing electroplating of a substrate held by a substrate holder, it is necessary to electrically connect the substrate to a negative pole of a power source. Accordingly, positioned e.g. inside a sealing member and in a region sealed with the sealing member, there is provided an electrical contact for electrically connecting the substrate to an external wire extending from a power source.

A known such electrical contact includes a metal contact plate of e.g. stainless steal having a horseshoe-shape cross-section, and a coil spring for biasing the metal contact plate toward a substrate. When the substrate is held by the substrate holder, one leg of the metal contact plate positioned on an outer side contacts an external wire through elastic force of the coil spring, while another leg of the metal contact plate positioned on an inner side contacts the substrate.

With a substrate holder having such an electrical contact, since the metal contact plate constituting the electrical contact is generally of a rigid body, the contact plate makes point contact with a substrate, and therefore, poor contact is likely to occur. Further, the metal contact plate contacts the substrate at a position somewhat inside a periphery of the substrate, which narrows an effective area for pattern formation in the substrate.

In addition, substrates and members generally vary in size. Due to this size variation and also to a positional relationship between a pair of supports, positioning (centering) of a substrate to be held by the supports with respect to a sealing member mounted to one of the supports is generally difficult. A separate provision of a special member for positioning of a substrate leads to a large-sized and complicated substrate holder.

Furthermore, according to the conventional substrate holder, a sealing member is mounted to one of a pair of supports and the sealing member is brought into pressure contact with a peripheral portion of a substrate placed and held on the other support, thereby sealing the peripheral portion of the substrate, as described above. There is, therefore, a case where when opening the support, to which the sealing member is mounted, to take the substrate out of the substrate holder after completion of plating, the support opens with the substrate sticking to the sealing member and the substrate falls from the support. Measures must therefore be taken to solve this problem.

SUMMARY OF THE INVENTION

The present invention has been made in view of the above situation in the prior art. It is therefore a first object of the present invention to provide a substrate holder which can effect a more complete sealing with a sealing member and makes it possible to take a substrate out of the substrate holder easily and securely, and also a plating apparatus provided with the substrate holder.

It is a second object of the present invention to provide a substrate holder which can broaden an effective area for pattern formation in a substrate, can easily effect centering of the substrate upon holding of the substrate, and makes it possible to take the substrate out of the substrate holder easily and securely, and also a plating apparatus provided with this substrate holder.

In order to achieve the above objects, the present invention provides a substrate holder, comprising: a fixed holding member and a movable holding member for holding a substrate therebetween; a sealing member mounted to the fixed holding member or the movable holding member; and a suction pad for attracting a back surface of the substrate held between the fixed holding member and the movable holding member.

Since the back surface of the substrate is kept attracted to the suction pad, when the movable holding member is moved after plating to release holding of the substrate and take the substrate out of the substrate holder, the substrate can be prevented from sticking to the sealing member and moving along with the sealing member. Further, since the substrate is thus prevented from being brought upward, when performing an automatic operation using an automatic transport device, the substrate can be taken out of the substrate holder stably.

The suction pad preferably includes a cup portion of a flexible material, with an inside space of the cup portion defining a decompression portion, and attracts the substrate by a suction force which is produced when the substrate presses the opening of the cup portion and forces air out of the decompression portion to thereby reduce pressure in the decompression portion.

The suction pad is a so-called suction cup. An attraction force of the suction pad is set at such a degree that when taking the substrate out of the substrate holder, the substrate can be moved horizontally away from the cup portion so that a vacuum can be broken, the substrate can be easily separated from the sealing member, and the substrate can be transferred to a transport robot. Thus, the suction pad has a strong adhesion to the substrate in a vertical direction, and therefore is effective for holding of the substrate, while it allows the substrate to move horizontally and detach from it easily. In a case where the movable member is designed to be openable and closable via a hinge, it is preferred to locate the suction pad on an opposite side of a center of the substrate, held between the fixed holding member and the movable holding member, from the hinge and at a position corresponding to a peripheral portion of the substrate. The suction pad at such a location prevents, when opening the movable holding member via the hinge, that peripheral portion of the substrate from sticking to the sealing member and being brought up, which portion would otherwise be first brought up, and can effectively separate the substrate from the sealing member.

The suction pad may be connected to a vacuum, and attracts the substrate by vacuuming through a vacuum line. This makes it possible to attract the substrate to the suction pad and hold the substrate on it easily and securely. This holding of the substrate can be released by stopping the vacuuming.

The present invention provides another substrate holder, comprising: a fixed holding member and a movable holding member for holding a substrate therebetween; and a sealing member, mounted to the movable holding member, for making pressure contact with a peripheral portion of the substrate to seal the peripheral portion, wherein the sealing member is held integrally by a holding member.

Since the sealing member is thus integrally mounted to a holding member, when the movable holding member is moved after plating to release holding of the substrate and the substrate is taken out of the substrate holder, the sealing portion of the sealing member can be prevented from adhering to the substrate, and the sealing member can be prevented from being torn off from the holding member. Releasability of the sealing member from the substrate can thus be improved.

It is preferred to use as the sealing member a multi-seal structure comprising at least two loop-shaped portions. By sealing a peripheral portion of the substrate with a sealing member comprised of the multi-seal structure, a sealing width is substantially widened, so that a more complete sealing can be attained even when centering of the substrate is not perfect.

The multi-seal structure preferably includes partition sealing portions extending in a width direction and provided at certain locations along a circumferential direction. By sealing certain portions along the circumferential direction of the sealing member with the partition sealing portions in the width direction, it becomes possible to maintain a sealing ability of the sealing member even when it is damaged.

The present invention provides yet another substrate holder, comprising: a fixed holding member and a movable holding member for holding a substrate therebetween; and a sealing member, mounted to the movable holding member, for sealing between the movable holding member and the fixed holding member; wherein the sealing member has a W-shaped cross-section, easily collapses when pressed in a width direction, and recovers by its own elastic force when a pressing force is released.

Use of such a sealing member can facilitate its insert into a seal groove, e.g. in a dovetail shape, and prevent it from falling from the seal groove securely. Further in this connection, there is a cut-away portion formed in the movable holding member, which portion is necessary for takeout of a tool upon formation of this dovetail-shaped seal groove. There is, therefore, a fear that a plating solution would intrude from the cut-away portion into the seal groove and, due to denaturing or solidification of the plating solution, a sealing ability of the sealing member would be lowered. In this regard, according to the substrate holder of this embodiment, side surfaces of the sealing member are in contact with sidewall surfaces of the seal groove with a certain elastic force. This prevents the above-described intrusion of plating solution, thereby ensuring sealing and enhancing durability of the sealing member.

The present invention provides yet another substrate holder, comprising: a fixed holding member and a movable holding member for holding a substrate therebetween; a sealing member mounted to the fixed holding member or the movable holding member; and a plate-shaped spring member for biasing the substrate toward the fixed holding member when releasing holding of the substrate between the movable holding member and the fixed holding member.

By use of the spring member, when the movable member is moved after plating to release holding of the substrate and take the substrate out of the substrate holder, movement of the substrate is restricted and the sealing member mounted to the movable holding member is detached from the substrate, whereby the substrate can be prevented from sticking to the sealing member and moving along with the sealing member.

The spring member is preferably a laminated leaf spring comprising a laminate of two or more leaf spring-shaped plates. Such a laminated leaf spring member can secure a long stroke without a plastic deformation and can be set in a considerably small space.

The present invention provides yet another substrate holder, comprising: a fixed holding member and a movable holding member for holding a substrate therebetween; a sealing member mounted to the fixed holding member or the movable holding member; and a leaf spring member for making elastic contact with a peripheral portion of the substrate when the substrate is held between the movable holding member and the fixed holding member.

Since the substrate is biased inwardly by an elastic force of the leaf spring member, positioning (centering) of the substrate relative to the substrate holder upon holding of the substrate by the substrate holder can be effected by the leaf spring member.

The movable holding member preferably has a function of positioning the substrate with respect to the sealing member.

Preferably, the leaf spring member also serves as an electrical contact that contacts the substrate to feed electricity to the substrate. This eliminates a need to separately provide the electrical contact, thus simplifying structure of the substrate holder.

The movable holding member preferably has a function of positioning the substrate with respect to the sealing member and the electrical contact.

By thus providing the movable holding member with the substrate-sealing member and preferably the electrical contact for feeding electricity to the substrate, and also a centering function for the substrate, it becomes possible to previously make a center of the movable holding member coincide with a center of the substrate-sealing member (and of the electrical contact) and, when the movable holding member engages the fixed holding member on which the substrate is placed, shift the substrate by the substrate-centering function of the movable holding member to a position where the center of the substrate coincides with the center of the movable holding member. Thus, the center of the substrate can be made to coincide with the center of the substrate-sealing member (and of the electrical contact for feeding electricity to the substrate) automatically upon engagement between the movable holding member and the fixed holding member.

In these days, an effective area of a substrate is shifting toward an outer side and a so-called edge exclusion region of the substrate is becoming extremely narrow. In such a situation, the above substrate holder makes it possible to securely effect sealing of a substrate and electric feeding to the substrate in this narrow region of the substrate.

The present invention provides yet another substrate holder, comprising: a fixed holding member and a movable holding member for holding a substrate therebetween; a sealing member mounted to the fixed holding member or the movable holding member; and at least one pair of conductors for detecting a liquid leak, which is provided in the fixed holding member and which, when a plating solution leaks to a back surface side of the substrate held between the movable holding member and the fixed holding member, short-circuits via this leaked plating solution.

When a liquid leak occurs and the pair of conductors short-circuits via a plating solution, an electric current begins to flow between the pair of conductors and an electric resistance changes (becomes not infinite). Accordingly, occurrence of a liquid leak can be detected quickly and securely by a simple measurement of the electric resistance.

The pair of conductors is preferably provided at a lower portion of the fixed holding member where leaked plating solution accumulates. By utilizing the fact that upon leakage of plating solution, this leaked plating solution accumulates at a lower portion of the fixed holding member, and thus disposing the conductors at such a local location, a liquid leak can be detected over an entire area of the substrate.

The pair of conductors may be disposed in a loop shape and positioned inside the sealing member when the substrate is held between the movable holding member and the fixed holding member.

The invention provides yet another substrate holder, comprising: a fixed holding member and a movable holding member for holding a substrate therebetween; an inner sealing member for making pressure contact with a peripheral portion of the substrate to seal the peripheral portion; and an outer sealing member, disposed around the substrate, for sealing between the fixed holding member and the movable holding member.

By thus providing the two sealing members, i.e. the inner sealing member and the outer sealing member, to separately effect sealing of a peripheral portion of the substrate with the inner sealing member and sealing between the movable holding member and the fixed holding member with the outer sealing member, an improved sealing can be effected.

Preferably, the inner sealing member and the outer sealing member are mounted to the movable sealing member.

Preferably, a step is provided in an outer peripheral portion of the movable holding member and a press ring is rotatably mounted fitly to the step, and the movable holding member is pressed via the press ring against the fixed holding member to hold the substrate.

Preferably, the fixed holding member is provided with a clamper for restricting movement of the press ring away from the fixed holding member.

By thus restricting movement of the press ring, rotatably mounted fitly to the step provided in an outer peripheral portion of the movable holding member, away from the fixed holding member by the clamper provided in the fixed holding portion, it becomes possible to shorten a distance between a forefront of the substrate holder and a substrate surface held by the substrate holder, whereby a stirrer (paddle) may be disposed closer to the substrate surface to thereby improve flow of plating solution over the surface of the substrate.

The present invention provides a plating apparatus comprising a substrate holder for holding a substrate and to be transported with the substrate while held and immersed in plating solution in a plating tank, the substrate holder comprising: a fixed holding member and a movable holding member for holding a substrate therebetween; a sealing member mounted to the fixed holding member or the movable holding member; and a suction pad for attracting a back surface of the substrate held between the fixed holding member and the movable holding member.

The present invention provides another plating apparatus comprising a substrate holder for holding a substrate and to be transported with the substrate while held and immersed in plating solution in a plating tank, the substrate holder comprising: a fixed holding member and a movable holding member for holding a substrate therebetween; and a sealing member, mounted to the movable holding member, for making pressure contact with a peripheral portion of the substrate to seal the peripheral portion, wherein the sealing member is held integrally by a holding member.

The present invention provides yet another plating apparatus comprising a substrate holder for holding a substrate and to be transported with the substrate while held and immersed in plating solution in a plating tank, the substrate holder comprising: a fixed holding member and a movable holding member for holding a substrate therebetween; and a sealing member, mounted to the movable holding member, for sealing between the movable holding member and the fixed holding member, wherein the sealing member has a W-shaped cross-section, easily collapses when pressed in a width direction, and recovers by its own elastic force when a pressing force is released.

The present invention provides yet another plating apparatus comprising a substrate holder for holding a substrate and to be transported with the substrate held and immersed in a plating solution in a plating tank, the substrate holder comprising: a fixed holding member and a movable holding member for holding a substrate therebetween; a sealing member mounted to the fixed holding member or the movable holding member; and a plate-shaped spring member for biasing the substrate toward the fixed holding member when releasing holding of the substrate between the movable holding member and the fixed holding member.

The present invention provides yet another plating apparatus comprising a substrate holder for holding a substrate and to be transported with the substrate while held and immersed in plating solution in a plating tank, the substrate holder comprising: a fixed holding member and a movable holding member for holding a substrate therebetween; a sealing member mounted to the fixed holding member or the movable holding member; and a leaf spring member for making elastic contact with a peripheral portion of the substrate when the substrate is held between the movable holding member and the fixed holding member.

The present invention provides yet another plating apparatus comprising a substrate holder for holding a substrate and to be transported with the substrate while held and immersed in plating solution in a plating tank, the substrate holder comprising: a fixed holding member and a movable holding member for holding a substrate therebetween; a sealing member mounted to the fixed holding member or the movable holding member; and at least one pair of conductors for detecting a liquid leak, which is provided in the fixed holding member and which, when a plating solution leaks to a back surface side of the substrate held between the movable holding member and the fixed holding member, short-circuits via this leaked plating solution.

The present invention provides yet another plating apparatus comprising a substrate holder for holding a substrate and to be transported with the substrate while held and immersed in plating solution in a plating tank, the substrate holder comprising: a fixed holding member and a movable holding member for holding a substrate therebetween; an inner sealing member for making pressure contact with a peripheral portion of the substrate to seal the peripheral portion; and an outer sealing member, disposed around the substrate, for sealing between the fixed holding member and the movable holding member.

The present invention provides yet another substrate holder, comprising: a fixed holding member and a moveable holding member for holding a substrate therebetween; and a sealing member for sealing an outer circumferential end of the substrate when the substrate is held between the moveable holding member and the fixed holding member, wherein the fixed holding member has a conductor, and the moveable holding member has an electrical contact in the form of a leaf spring member for being electrically connected to the conductor in an area sealed by the sealing member to supply the substrate with electric energy when the substrate is held between the movable holding member and the fixed holding member.

By thus forming the electrical contact in a leaf spring shape and allowing the electrical contact to make contact with the substrate through elastic force of the electrical contact per se, it becomes possible to reduce poor electrical contact. Further, since a contact portion contacts a peripheral portion, outer of a sealing portion, of the substrate, an effective area for pattern formation in the substrate can be broadened.

The electrical contact is preferably adapted to make elastic contact with a surface of the substrate when the substrate is held between the movable holding member and the fixed holding member.

The electrical contact is preferably adapted to make elastic contact with an outer circumferential edge of the substrate when the substrate is held between the movable holding member and the fixed holding member.

Since the substrate is biased inwardly by an elastic force of the contact portion of this leaf spring-shaped electrical contact, positioning (centering) of the substrate relative to the substrate holder upon holding of the substrate by the substrate holder can be effected by the electrical contact. Further, by providing the movable holding member with the sealing member and the electrical contact, and effecting positioning (centering) of the substrate relative to the substrate holder by the electrical contact, it becomes possible to make a positional relationship between the substrate, the sealing member and the electrical contact always constant when the substrate is held by the substrate holder.

Preferably, the electrical contact has a tip for contacting the substrate, with the tip being divided into at least two segments or comprising parallel segments disposed in respective adjacent positions. With this arrangement, even if dirt or the like is attached to contact portions of some of the electrical contacts, other electrical contacts are kept electrically connected to the substrate.

These divided segments or parallel segments may have portions for contacting the substrate, with the portions being staggered in a radial direction of the substrate. With this arrangement, even if the substrate suffers a slight positioning error, at least some of the electrical contacts are brought into contact with the substrate.

The present invention provides yet another substrate holder, comprising: a fixed holding member and a movable holding member for holding a substrate therebetween; and a sealing member mounted to the fixed holding member or the movable holding member, wherein the fixed holding member and the movable holding member have respective tapered portions for engaging each other and positioning the fixed holding member and the movable holding member in central alignment with each other when the substrate is held between the movable holding member and the fixed holding member.

By thus providing the fixed holding member and the movable holding member with the tapered portions, positioning of the members with respect to a center can be effected automatically through engagement between the tapered portions in the course of holding the substrate by the members, if the members are not correctly positioned when they are away from each other.

The tapered portion of the movable holding member is preferably adapted to guide an outer circumferential edge of the substrate to position the substrate when the substrate is held between the movable holding member and the fixed holding member.

This makes it possible to position the fixed holding member and the movable holding member with respect to the center and position (center) the substrate with respect to the substrate holder simultaneously in the course of holding the substrate by the members.

The present invention provides yet another substrate holder, comprising: a fixed holding member and a movable holding member for holding a substrate therebetween; a sealing member mounted to the fixed holding member or the movable holding member; and a springy leaf spring member, mounted to the fixed holding member, which has a free end positioned inwardly of an outer circumferential portion of the substrate when the substrate is held between the movable holding member and the fixed holding member, and positioned outwardly of the outer circumferential portion of the substrate when holding of the substrate between the movable holding member and the fixed holding member is released.

Since movement of the substrate is restricted by a free end of the leaf spring member positioned inwardly of an outer circumferential portion of the substrate, when the movable holding member is moved after plating to release holding of the substrate and take the substrate out of the substrate holder, the substrate can be prevented from sticking to the sealing member and moving along with the sealing member. With this movement of the substrate, the free end of the leaf spring member is positioned outwardly of the outer circumferential portion of the substrate, whereby a processed substrate is not prevented from being taken out of the substrate holder by the leaf spring member, and a substrate to be processed is not prevented by the leaf spring member from being inserted in place.

The free end of the leaf spring member is preferably adapted to make elastic contact with a surface of the substrate when the substrate is held between the movable holding member and the fixed holding member.

The free end of the leaf spring member is preferably adapted to make elastic contact with an outer circumferential edge of the substrate when the substrate is held between the movable holding member and the fixed holding member. Since the substrate is biased inwardly by an elastic force of the leaf spring member, positioning (centering) of the substrate relative to the substrate holder upon holding of the substrate by the substrate holder can be effected by the leaf spring member.

Preferably, the leaf spring member also serves as an electrical contact for supplying the substrate with electric energy when the substrate is held between the movable holding member and the fixed holding member. With this arrangement, it is not necessary to provide a dedicated leaf spring member for the sole purpose of separating the substrate from the sealing member when the substrate holder releases the substrate, and hence the substrate holder can be simplified in terms of structure.

The present invention provides yet another substrate holder, comprising: a fixed holding member and a moveable holding member for holding a substrate therebetween; a sealing member for sealing an outer circumferential end of the substrate when the substrate is held between the movable holding member and the fixed holding member; and a springy leaf spring member for making elastic contact with an outer circumferential edge of the substrate in an area sealed by the sealing member to position the substrate when the substrate is held between the movable holding member and the fixed holding member.

Since the substrate is biased inwardly by the elastic force of the springy leaf spring member, positioning (centering) of the substrate relative to the substrate holder upon holding of the substrate by the substrate holder can be effected by the leaf spring member. Further, by providing the movable holding member with the sealing member and the electrical contact, and effecting positioning (centering) of the substrate relative to the substrate holder by the electrical contact, it becomes possible to make a positional relationship between the substrate, the sealing member and the electrical contact always constant when the substrate is held by the substrate holder.

It is preferred that the movable holding member further comprises an electrical contact for making elastic contact with the substrate to supply the substrate with electric energy when the substrate is held between the movable holding member and the fixed holding member.

The present invention provides yet another substrate holder, comprising: a fixed holding member and a moveable holding member for holding a substrate therebetween; and a sealing member for sealing an outer circumferential end of the substrate when the substrate is held between the movable holding member and the fixed holding member, wherein the sealing member has lips for contacting a peripheral portion of the substrate and a surface of the fixed holding member, respectively, when the substrate is held between the movable holding member and the fixed holding member, and is integrally held by a support body which is mounted in a place between the lips.

Since the sealing member is thus integrally held by a support body, when the movable holding member is moved after plating to release holding of the substrate and the substrate is taken out of the substrate holder, a sealing portion of the sealing member can be prevented from adhering to the substrate, and the sealing member can be prevented from being torn off from the holding member. Releasability of the sealing member from the substrate can thus be improved.

The present invention provides yet another plating apparatus comprising a substrate holder for holding a substrate and to be transported with the substrate while held and immersed in plating solution in a plating tank, the substrate holder comprising: a fixed holding member and a moveable holding member for holding a substrate therebetween; and a sealing member for sealing an outer circumferential end of the substrate when the substrate is held between the movable holding member and the fixed holding member, wherein the fixed holding member has a conductor, and the moveable holding member has an electrical contact in the form of a leaf spring member for being electrically connected to the conductor in an area sealed by the sealing member to supply the substrate with electric energy when the substrate is held between the movable holding member and the fixed holding member.

The present invention provides yet another plating apparatus comprising a substrate holder for holding a substrate and to be transported with the substrate while held and immersed in plating solution in a plating tank, the substrate holder comprising: a fixed holding member and a movable holding member for holding a substrate therebetween; and a sealing member mounted to the fixed holding member or the movable holding member, wherein the fixed holding member and the movable holding member have respective tapered portions for engaging each other and positioning the fixed holding member and the movable holding member in central alignment with each other when the substrate is held between the movable holding member and the fixed holding member.

The present invention provides yet another plating apparatus comprising a substrate holder for holding a substrate and to be transported with the substrate while held and immersed in plating solution in a plating tank, the substrate holder comprising: a fixed holding member and a movable holding member for holding a substrate therebetween; a sealing member mounted to the fixed holding member or the movable holding member; and a springy leaf spring member, mounted to the fixed holding member, which has a free end positioned inwardly of an outer circumferential portion of the substrate when the substrate is held between the movable holding member and the fixed holding member, and positioned outwardly of the outer circumferential portion of the substrate when holding of the substrate between the movable holding member and the fixed holding member is released.

The present invention provides yet another plating apparatus comprising a substrate holder for holding a substrate and to be transported with the substrate while held and immersed in plating solution in a plating tank, the substrate holder comprising: a fixed holding member and a moveable holding member for holding a substrate therebetween; a sealing member for sealing an outer circumferential end of the substrate when the substrate is held between the movable holding member and the fixed holding member; and a springy leaf spring member for making elastic contact with an outer circumferential edge of the substrate in an area sealed by the sealing member to position the substrate when the substrate is held between the movable holding member and the fixed holding member.

The present invention provides yet another plating apparatus comprising a substrate holder for holding a substrate and to be transported with the substrate while held and immersed in plating solution in a plating tank, the substrate holder comprising: a fixed holding member and a moveable holding member for holding a substrate therebetween; and a sealing member for sealing an outer circumferential end of the substrate when the substrate is held between the movable holding member and the fixed holding member, wherein the sealing member has lips for contacting a peripheral portion of the substrate and a surface of the fixed holding member, respectively, when the substrate is held between the movable holding member and the fixed holding member, and is integrally held by a support body which is mounted in a place between the lips.

The above and other objects, features, and advantages of the present invention will be apparent from the following description when taken in conjunction with the accompanying drawings which illustrates preferred embodiments of the present invention by way of example.

BRIEF DESCRIPTION OF DRAWINGS

FIG. 4 is a vertical sectional front view of the substrate holder shown in FIG. 1;

FIG. 11 is a cross-sectional view of a laminated leaf spring as a leaf spring member;

FIG. 12 is a plan view of another inner sealing member;

FIG. 14 is a transverse sectional view of FIG. 12;

FIG. 15 is a plan view of a substrate holder according to another embodiment of the present invention;

FIG. 23A is a cross-sectional view of another electrical contact before holding of a substrate;

FIG. 23B is a cross-sectional view of the another electrical contact after holding of a substrate;

FIGS. 24A through 24F are diagrams illustrating, in a sequence of steps, a relationship between an electrical contact/leaf spring member, serving both as an electrical contact and as a leaf spring member, and a member that engages the electrical contact/leaf spring member to deform the electrical contact/leaf spring member;

DETAILED DESCRIPTION OF THE PREFERRED EMBODIMENTS

Preferred embodiments of the present invention will now be described with reference to drawings.

Figure 1:
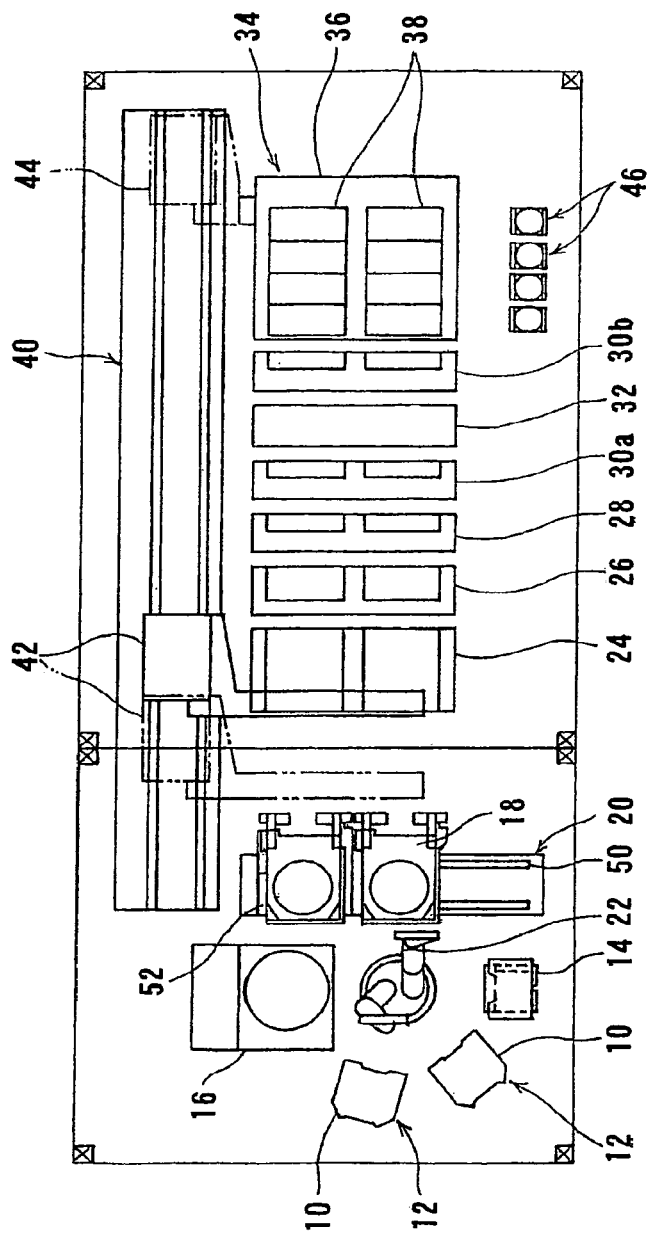
FIG. 1 is a layout plan of a plating apparatus provided with a substrate holder according to an embodiment of the present invention.

FIG. 1 shows a layout plan of a plating apparatus provided with a substrate holder according to an embodiment of the present invention. As shown in FIG. 1, the plating apparatus includes two cassette tables 12 each for placing thereon a cassette 10 for housing substrates W such as semiconductor wafers, an aligner 14 for aligning a position of an orientation flat or a notch of substrate W in a predetermined direction, and a spin drier 16 for rotating the substrate W after plating at a high speed to dry the substrate. Further, a substrate attaching/detaching section 20 for placing thereon a substrate holder 18 for detachably holding the substrate W, and attaching/detaching the substrate W to/from the substrate holder 18, is provided near the spin drier 16. Furthermore, a substrate transfer device 22, comprised of a transfer robot, is disposed centrally above units for transferring the substrate W between the units.

The plating apparatus also includes, disposed in order from the substrate attaching/detaching section 20 side, a stocker 24 for stocking and temporarily housing the substrate holder 18, a pre-wetting tank 26 for immersing the substrate W in pure water, a presoaking tank 28 for etching away an oxide film on a seed layer 500 (see FIGS. 27A to 27C) formed on a surface of the substrate W, a first water-washing tank 30a for washing the surface of the substrate W with pure water, a blow tank 32 for draining (drying) the substrate W after washing, a second water-washing tank 30b, and a plating tank 34. The plating tank 34 houses a plurality of copper plating units 38 in an overflow tank 36. Each copper plating unit 38 houses one substrate W to perform copper plating of the substrate. Though copper plating is performed in this embodiment, the plating apparatus is of course applicable to other types of plating, such as nickel, solder, silver and gold plating.

Further, positioned on one side of the above devices and tanks, there is provided a substrate holder transport device 40, which employs e.g. a linear motor system, for transporting the substrate holder 18 together with the substrate W between the devices and tanks. The substrate holder transport device 40 includes a first transporter 42 for transporting the substrate W between the substrate attaching/detaching section 20 and the stocker 24, and a second transporter 44 for transporting the substrate W between the stocker 24, the pre-wetting tank 26, the presoaking tank 28, the water-washing tanks 30a, 30b, the blow tank 32 and the plating tank 34. In this regard, it is possible to provide only the first transporter 42 without providing the second transporter 44.

On an opposite side of the overflow tank 36 from the substrate transport device 40 are disposed paddle drive devices 46 for driving a paddle (not shown) provided in each copper plating unit 38 as a stirrer for stirring a plating solution.

The substrate attaching/detaching section 20 includes a tabular loading plate 52 which is slidable laterally along rails 50. Two substrate holders 18 are placed horizontally and in parallel on the loading plate 52. After one substrate W is transferred between one substrate holder 18 and the substrate transfer device 22, the loading plate 52 is slid laterally so that another substrate is transferred between the other substrate holder 18 and the substrate transfer device 22.

As shown in FIGS. 2 through 7, the substrate holder 18 includes a rectangular tabular fixed holding member 54 made of, for example, a vinyl chloride resin, and a movable holding member 58 mounted openably and closably via a hinge 56 on the fixed holding member 54. Though in this embodiment the movable holding member 58 is designed to be openable and closable by the hinge 56, it is also possible, for example, to dispose the movable holding member 58 opposite to the fixed holding member 54, and open and close the movable holding member 58 by moving it to and away from the fixed holding member 54.

The movable holding member 58 includes a base portion 58a and a support portion 58b which has a ring shape according to this embodiment. The movable holding member 58 is made of, for example, a vinyl chloride resin so that it exhibits good slippage with below-described press ring 60. On a far side surface of the support portion 58b from the fixed holding member 54 is mounted by bolts 64 (see FIGS. 6A to 6C) an inwardly protruding sealing member (hereinafter referred to as "inner sealing member") 62 for contacting a peripheral portion of the substrate W to seal the portion. On the other hand, a dovetail-shaped seal groove 66 is formed in a surface of the support portion 58b on the holding member 54 side, and a sealing member (hereinafter referred to as "outer sealing member") 68 for sealing the fixed holding member 54 and the movable holding member 58 is fitted into the seal groove 66.

The inner sealing member 62 is to make pressure contact with a peripheral portion of a surface (to-be-plated surface) of the substrate W when it is held by the substrate holder 18, thereby sealing that portion, and has at its inner periphery a steeple-shaped sealing portion 62a which protrudes downwardly and makes linear contact with the peripheral portion of the substrate W. The inner sealing member 62 is mounted integrally on a holding member 70, made of e.g. titanium, which holds the sealing member 62. In particular, the inner sealing member 62 is attached to the holding member 70 such that the sealing member 62 covers almost the entire surface of the holding member 70, thereby preventing the sealing member 62 from peeling or falling from the holding member 70.

Since the inner sealing member 62 is thus integrally mounted on the holding member 70, when the movable holding member 58 is moved after plating to release holding of the substrate W and the substrate W is taken out of the substrate holder 18, the sealing portion 62a of the inner sealing member 62 can be prevented from adhering to the substrate W, and hence the inner sealing member 62 can be prevented from being torn off from the holding member 70. Releasability of the sealing member 62 from the substrate W can thus be improved. Further, since the inner sealing member 62 makes linear contact with the substrate W, sealing can be effected securely at a low clamping pressure and, in addition, an effective area for pattern formation in the substrate W can be broadened.

The inner sealing member 62, mounted integrally to the holding member 70, is mounted by bolts 64 to the support portion 58b of the movable holding member 58. A ring-shaped sealing member 71 is interposed between the inner sealing member 62 and the support portion 58b. The bolts 64 are disposed outside of the sealing member 71, and the inner sealing member 62 is fixed to the support portion 58b by fastening the bolts 64 to squash the sealing member 71. This prevents leakage of water from an interstice between the inner sealing member 62 and the holding portion 58b, shown by the arrow in FIG. 6A, or from portions where the bolts 64 are fixed.

The outer sealing member 68, on the other hand, is to make pressure contact with a movable holding member 58 side surface of the fixed holding member 54 to seal the contact portion when the substrate W is held by the substrate holder 18. According to this embodiment, the outer sealing member 68 has a W-shaped cross-section, has sealing portions 68a, 68b in lower and upper surfaces at almost a center in a width direction, and broadens toward a bottom of the seal groove 66. When a broad portion of the outer sealing member 68 is pressed in the width direction, the portion easily collapses and narrows. Upon release of a pressing force, the portion recovers by elastic force. When fitting the outer sealing member 68 into the dovetail-shaped seal groove 66, the broad portion of the outer sealing member 68 is collapsed in the width direction, thereby facilitating insertion of the outer sealing member 68 into the seal groove 66. After this insertion, the outer sealing member 68 expands by elastic force, whereby the sealing member can be prevented from falling from the seal groove 66.

Figure 7:
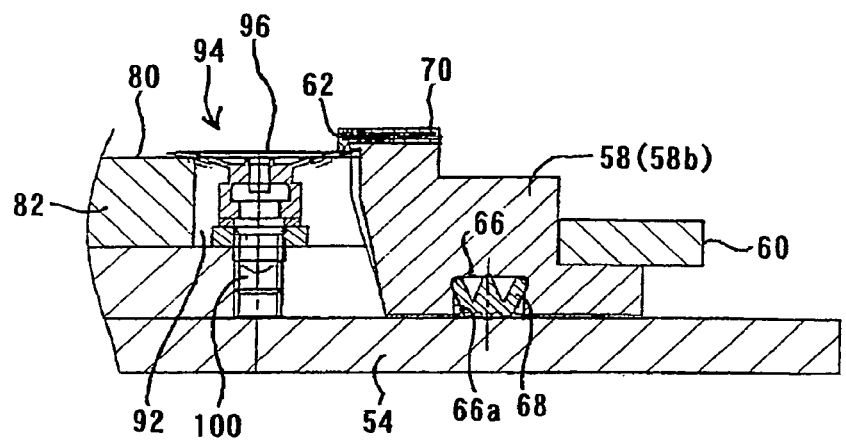
FIG. 7 is a cross-sectional view of a portion of the substrate holder shown in FIG. 1 in which a suction pad is provided.

As shown in FIG. 7, there is a cut-away portion 66a formed in the movable holding member 58 which is necessary for removal of a tool upon formation of the dovetail-shaped seal groove 66. There is, therefore, a fear that a plating solution would intrude from the cut-away portion 66a into the seal groove 66 and, due to denaturing or solidification of the plating solution, a sealing ability of the outer sealing member 68 would be lowered. In this regard, according to this embodiment, side surfaces of the outer sealing member 68 are in contact with sidewall surfaces of the seal groove 66 with a certain elastic force. This presents the above-described intrusion of plating solution, thereby ensuring sealing and enhancing durability of the outer sealing member 68.

A step is provided in an outer peripheral portion of the movable holding member 58, and press ring 60 is fitly supported unescapably and rotatably to the step by press plates 72. The press ring 60 is made of, for example, titanium that is highly resistant to an oxidizing atmosphere and has sufficient rigidity.

Positioned outside the press ring 60, inversed L-shaped clampers 74, each having an inwardly protruding portion, are mounted vertically on the fixed holding member 54 at regular intervals along a circumferential direction of the fixed holding member 54. An upper surface of each outwardly protruding portion of the press ring 60 and a lower surface of the inwardly protruding portion of each clamper 74 are tapered circumferentially in opposite directions. Further, a plurality of long holes 60a (e.g. four holes) are formed in the press ring 60 along a circumferential direction. As will be described below, rotating pins 112 are inserted into the long holes 60a, and the pins 112 are rotated to thereby rotate the press ring 60.

When the movable holding member 58 is open, the substrate W is inserted into a center of the fixed holding member 54, and then the movable holding member 58 is closed by the hinge 56. The press ring 60 is rotated clockwise so as to slip the outwardly protruding portions of the press ring 60 in under the inwardly protruding portions of the clampers 74. The fixed holding member 54 and the movable holding member 58 are fastened to each other via the tapered surfaces of the press ring 60 and the clampers 74, whereby the movable holding member 58 is locked. This locking is released by rotating the press ring counterclockwise and thereby drawing the outwardly protruding portions of the press ring 60 from the inversed L-shaped clampers 74. When the movable holding member 58 is thus locked, the sealing portion 62a of the inner sealing member 62 is in pressure contact with the surface of the substrate W, while with respect to the outer sealing member 68, the sealing portion 68a is in pressure contact with a surface of the fixed holding member 54 and the sealing portion 68b is in pressure contact with a bottom surface of the seal groove 66. The sealing members 62, 68 are respectively under a uniform pressure so that a sufficient sealing is ensured.

In the center of the fixed holding member 54 is provided an upwardly protruding ring-shaped ridge 82 with its size meeting a size of the substrate W. An upper surface of the ridge 82 serves as a support surface 80 that contacts a peripheral portion of the substrate W and supports the substrate W. Recesses 84 are formed in the ridge 82 at certain locations along a circumferential direction.

Figure 2:
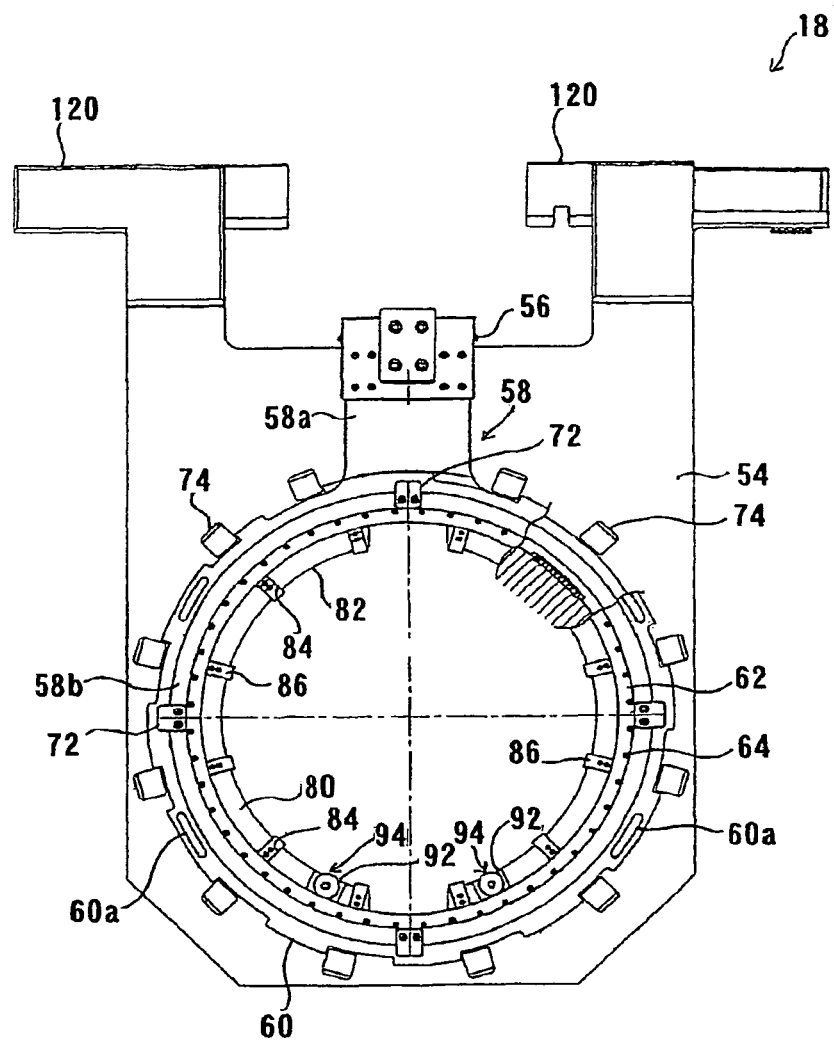
FIG. 2 is a plan view of the substrate holder shown in FIG. 1.

As shown in FIG. 2 and FIGS. 5A through 5C, a plurality of conductors (electrical contacts) 86 (twelve conductors are shown in FIG. 2) is disposed in the recesses 84, which conductors 86 are respectively connected to a plurality of wires extending from external contacts provided in below-described hands 120. When the substrate W is placed on the support surface 80 of the fixed holding member 54, end portions of the conductors 86 with spring properties are exposed on the surface of the fixed holding member 54, and are beside the substrate W.

On the other hand, a leg portion 88a each of electrical contacts 88 is fixed to the support portion 58b of the movable holding member 58 at a location where it is opposed to each conductor 86. The electrical contact 88 is formed in a leaf spring shape, and has a positioning (centering) function for the substrate W and a function of preventing the substrate W from sticking to the sealing portion 62a of the inner sealing member 62 and being brought up along with the sealing portion 62a when taking the substrate W after plating out of the substrate holder 18. Thus, the electrical contact 88 has a contact portion 88b positioned below the inner sealing member 62 and protruding inwardly in a leaf spring shape. The contact portion 88b bends easily due to its spring properties and, when the substrate W is held by the fixed holding member 54 and the movable holding member 58, makes elastic contact with a peripheral portion of the substrate W supported on the support surface 80 of the fixed holding member 54.

Figure 5A:
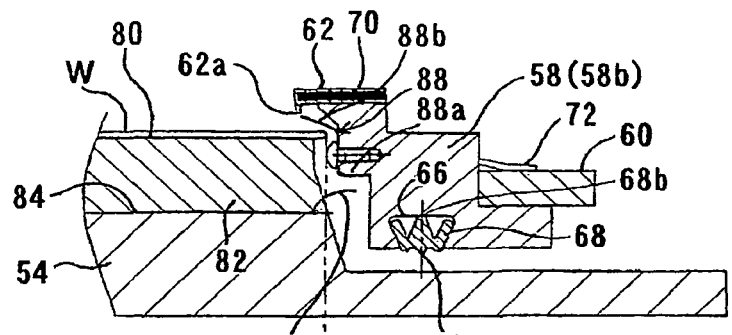
FIGS. 5A through 5C are diagrams illustrating a relationship between a conductor, an electrical contact and a substrate in the course of holding of the substrate by the substrate holder shown in FIG. 1.
Figure 5B:
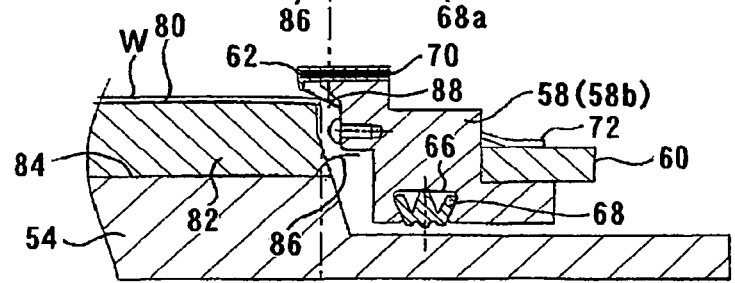
Figure 5C:
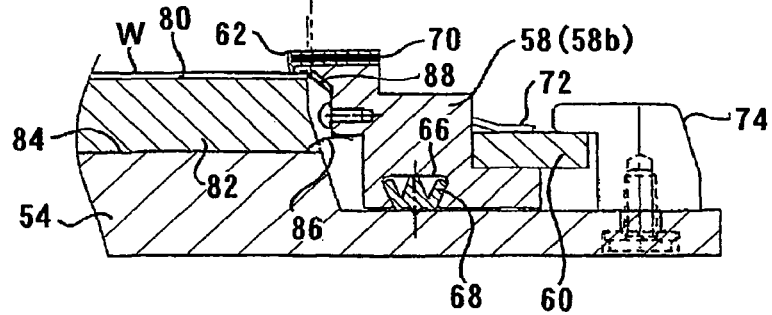

When the substrate W is placed on the support surface 80 of the fixed holding member 54 as shown in FIG. 5A, and the movable holding member 58 is then moved to the fixed holding member 54 to lock the movable holding member 58 and hold the substrate W as shown in FIGS. 5B and 5C, an exposed portion of the conductor 86, by its elastic force, makes an elastic contact with a lower surface of the leg portion 88a of the electrical contact 88 to thereby make an electrical connection, and the contact portion 88b of the electrical contact 88, by its elastic force, makes an elastic contact with the substrate W. Feeding of electricity to the substrate W via the electrical contacts 88 can thus be effected while the substrate W is held with the substrate holder 18 and sealed with the sealing members 62, 68.

By thus forming each electrical contact 88 in a leaf spring shape and allowing a front end of the contact portion 88b of the electrical contact 88 to make contact with the substrate W through the elastic force of the electrical contact 88 per se, it becomes possible to reduce poor electrical contact. Further, since the contact portion 88b contacts a peripheral portion, outer of a sealing portion, of the substrate W, an effective area for pattern formation in the substrate W can be broadened. Further, since the substrate W is biased inwardly by the elastic force of the contact portion 88b of the leaf spring-shaped electrical contact 88, positioning (centering) of the substrate W relative to the substrate holder 18 upon holding of the substrate by the substrate holder 18 can be effected by the electrical contact 88. Furthermore, by providing the movable holding member 58 with the inner sealing member 62 and the electrical contacts 88, and effecting positioning of the substrate W relative to the substrate holder 18 by the electrical contacts 88, it becomes possible to make a positional relationship between the substrate W, the sealing member 62 and the electrical contacts 88 always constant when the substrate W is held by the substrate holder 18.

When taking the substrate W out of the substrate holder 18 after completion of a series of processings, the movable holding member 58 is moved away from the fixed holding member 54. During this movement, as shown in FIGS. 5C and 5B, the contact portion 88b of each electrical contact 88 is in pressure contact with the peripheral portion of the substrate W so that the substrate W is biased downwardly. Movement of the substrate W is thus restricted by the electrical contacts 88. Accordingly, if the sealing member 62 sticks to the substrate W, only the sealing member 62 and the movable holding member 58 move upward, whereas the substrate W is forcibly detached from the sealing member 62. When the movable holding member 58 further moves upward, the contact portions 88b of the electrical contacts 88 detach from the substrate W, returning to a position shown in FIG. 5A.

Thus, when the movable holding member 58 is moved after plating to release holding of the substrate W and take the substrate W out of the substrate holder 18, the substrate W can be prevented from sticking to the sealing member 62 and moving along with the sealing member 62.

With reference to the conductor 86, it is preferred that at least a surface to make contact with the electrical contact 88 have a coating of e.g. gold or platinum plating.

Figure 6A:
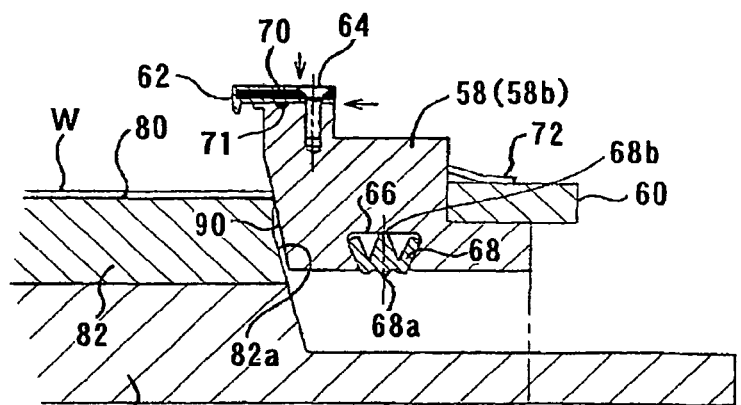
FIGS. 6A through 6C are diagrams illustrating a relationship between a tapered portion of a fixed holding member and a tapered portion of a movable holding member in the course of holding of a substrate by the substrate holder shown in FIG. 1.
Figure 6B:
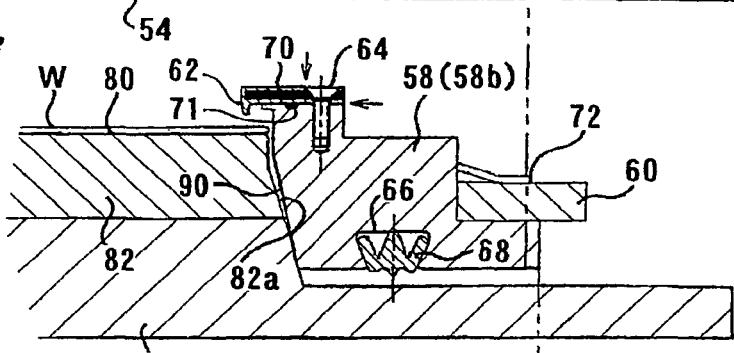
Figure 6C:
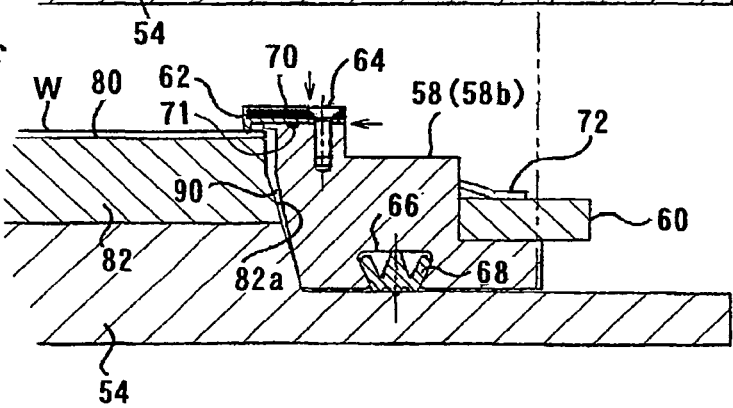

As shown in FIGS. 6A to 6C, the ridge 82 of the fixed holding member 54 partly has a tapered portion 82a with a steeple-shaped tapered surface, while the support portion 58b of the movable holding member 58 has in its inner circumferential surface a tapered portion 90 to be opposed to the tapered portion 82a and having a reverse tapered surface relative to the tapered surface of the tapered portion 82a. When the substrate W is held with the fixed holding member 54 and the movable holding member 58, the tapered portion 82a and the tapered portion 90 engage each other to effect positioning of the members 54, 58 with respect to a center. Thus, when the substrate W is placed on the support surface 80 of the fixed holding member 54 as shown in FIG. 6A, and the movable holding member 58 is then moved to the fixed holding member 54 to lock the movable holding member 58 and hold the substrate W as shown in FIGS. 6B and 6C, the tapered portions 82a, 90 serve as a mutual guide for positioning of the movable holding member 58 relative to the fixed holding member 54, or vice versa.

By thus providing the ridge 82 of the fixed holding member 54 and the support portion 58b of the movable holding member 58 with the tapered portions 82a, 90, positioning of the members 54, 58 with respect to the center can be effected automatically through engagement between the tapered portions 82a, 90 in the course of holding the substrate W by the members 54, 58, if the members 54, 58 are not correctly positioned when they are away from each other.

As described above, positioning of the fixed holding member 54 and the movable holding member 58 with respect to the center and positioning (centering) of the substrate W with respect to the substrate holder 18, and thus with respect to the inner sealing member 62, can be effected simultaneously in the course of holding the substrate W by the members 54, 58.

However, a precise centering can be effected with difficulty only through engagement between the tapered portions 82a, 90. This is because a clearance, if small, is necessary between the two tapered portions 82a, 90 in order to facilitate engagement therebetween. Accordingly, a center of the substrate W inevitably deviates from the center of the movable holding member 58 by the clearance. In view of this, the movable holding member 58 is provided with a plurality of leaf spring members 140, as will be described later. The leaf spring members 140 make elastic contact with a peripheral edge of the substrate W and evenly apply a pressing force acting to move the substrate W toward the center of the movable member 58. Accordingly, when the movable holding member 58 engages the fixed holding member 54, the substrate W is shifted so that the center of the substrate can coincide exactly with the center of the movable holding member 58. It is of course possible that a plurality of leaf springs take the form of an integral structure that surrounds a periphery of the substrate.

Further, the movable holding member and the fixed holding member are not necessarily coupled by the hinge, and may of course be separated.

As shown in FIG. 2, relatively wide recesses 92 are formed in the ridge 82 of the fixed holding member 54 on a far side from the hinge 56 at two locations according to this embodiment. A suction pad 94 is housed in each recess 92. As shown in detail in FIG. 7, the suction pad 94 is made of a flexible material, such as rubber, has a conical cup 96 having a decompression portion inside, and is mounted by a bolt 100 on the fixed holding member 54. When the substrate W is held by the substrate holder 18, the substrate W presses an opening of the cup portion 96 and expands the cup portion 96 outwardly, so that air in the suction pad 94 is forced out and the pressure in the decompression portion is reduced, whereby a back surface of the substrate W is attracted by suction to the suction pad 94.

Since the back surface of the substrate W is kept attracted to the suction pad 94, when the movable holding member 58 is moved after plating to release holding of the substrate W and take the substrate W out of the substrate holder 18, the substrate W can be prevented from sticking to the sealing member 62 and moving along with the sealing member 62. Further, since the substrate W is thus prevented from being brought upward, when performing an automatic operation using an automatic transport device, the substrate W can be taken out of the substrate holder 18 stably. An attraction force of the suction pad 94 is set at such a degree that when taking the substrate W out of the substrate holder 18 in the above-described manner, the substrate W can be moved horizontally away from the cup portion so that a vacuum can be broken, the substrate W can be easily separated from the sealing member 62, and the substrate W can be transferred to a robot. Thus, the suction pad 94 has a strong adhesion to the substrate W in a vertical direction, and therefore is effective for holding of the substrate, while it allows the substrate W to move horizontally and detach from it easily.

Though a location and number of suction pads 94 may be determined arbitrarily, it is preferred to locate a suction pad 94 on an opposite side of the center of the substrate W, held by the substrate holder 18, from the hinge 64 and at a position corresponding a peripheral portion of the substrate W. A suction pad 94 at such a location prevents, when opening the movable holding member 58 via the hinge 56, that peripheral portion of the substrate W from sticking to the inner sealing member 62 and being brought up, which portion would otherwise be first brought up, and can effectively separate the substrate W from the inner sealing member 62.

It is also possible to use a suction pad of a so-called vacuum attraction type. In particular, though not shown diagrammatically, a vacuum line extends in an interior of the fixed holding member 54 and communicates with an interior of the suction pad. When the substrate is held by the substrate holder 18, the interior of the suction pad is vacuumed through the vacuum line, thereby attracting the substrate and holding it on the pad easily and securely. This holding of the substrate can be released by stopping vacuuming.

Figure 3:
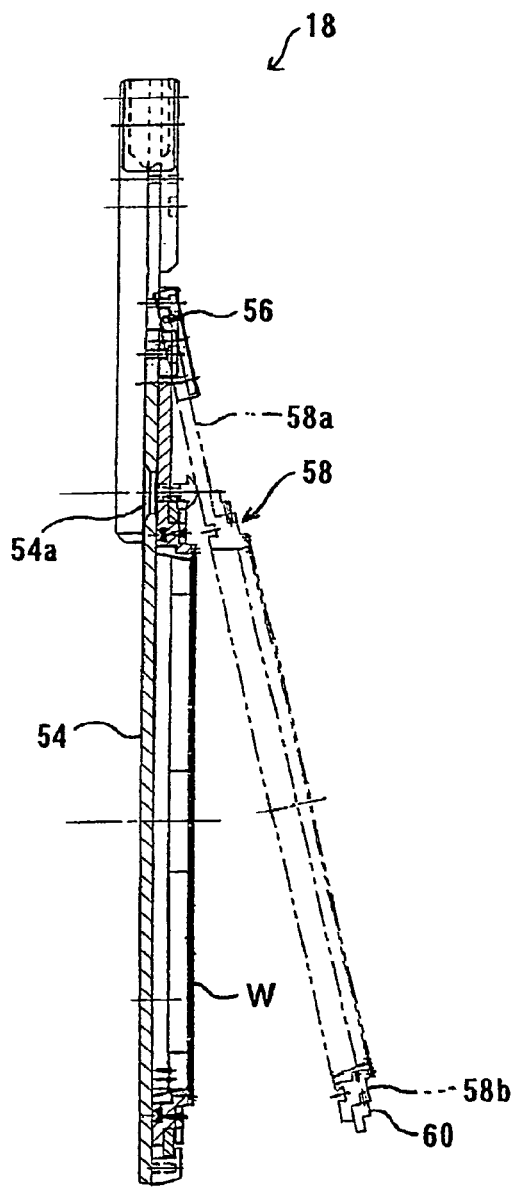
FIG. 3 is a sectional right side view of the substrate holder shown in FIG. 1.

Opening and closing of the movable holding member 58 is performed through a not-shown cylinder and weight of the movable holding member 58 per se. In particular, as shown in FIG. 3, a through-hole 54a is formed in the fixed holding member 54 and the cylinder is provided at a location where the cylinder faces the through-hole 54a when the substrate holder 18 is placed on the loading plate 52. The movable holding member 58 is opened by extending a cylinder rod and allowing a pressing rod to pass through the through-hole 54 and press up the base portion 58a of the movable holding member 58, while the holding member 58 is closed by its own weight by retracting the cylinder rod.

Figure 8:
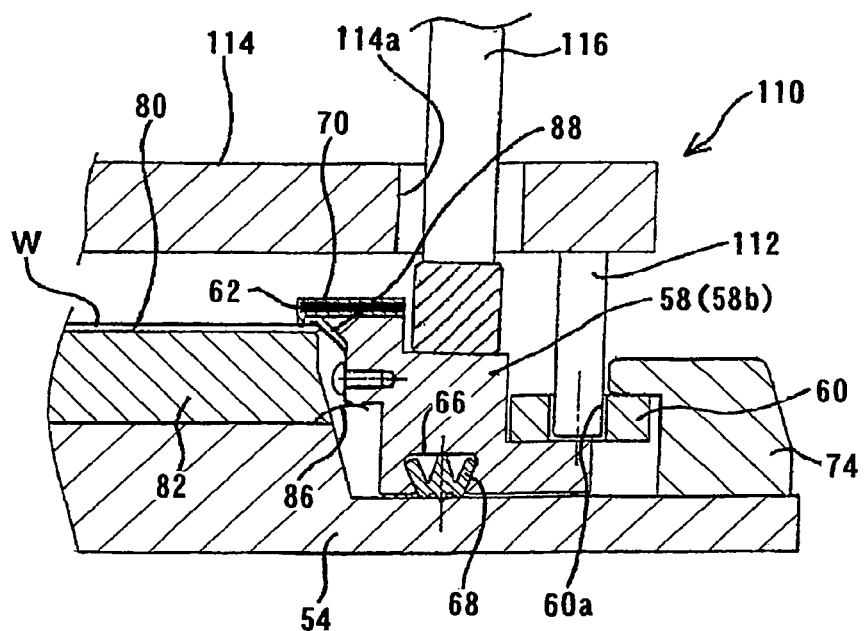
FIG. 8 is a cross-sectional view showing a state of the substrate holder when it is locked by a locking/unlocking mechanism.
Figure 9:
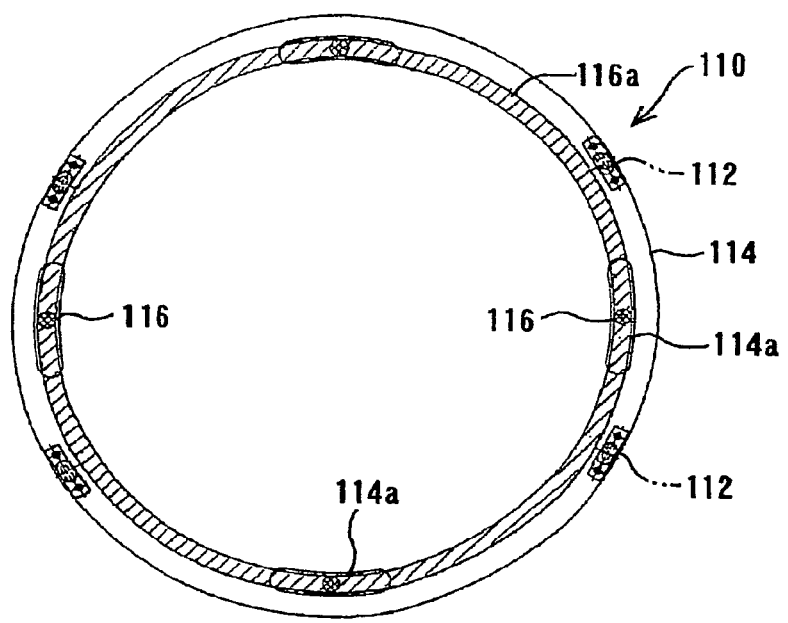
FIG. 9 is a plan view of the locking/unlocking mechanism.

According to this embodiment, locking/unlocking of the movable holding member 58 is effected by rotating the press ring 60. FIGS. 8 and 9 show a locking/unlocking mechanism 110. The locking/unlocking mechanism 110 is provided on a ceiling side, and includes rotating pins 112 each at a location corresponding to each long hole 60a of the press ring 60 of the movable holding member 58 when the substrate W is placed in the substrate holder 18 on the loading plate 52 and the movable holding member 58 is closed via the hinge 56. The rotating pins 112 are mounted vertically to a lower surface of a rotary plate 114 which is rotatable in both directions. The locking/unlocking mechanism 110 is also provided with vertically movable pressing rods 116 for pressing the support portion 58b of the movable holding member 58 of the substrate holder 18 on the loading plate 52 against the fixed holding member 54. In the rotary plate 114 are formed circumferentially extending long holes 114a at locations corresponding to the pressing rods 116.

In operation, the substrate holder 18, with the substrate W placed therein and the movable holding member 58 closed, is raised along with the loading plate 52 so as to locate the rotating pins 112 in the long holes 60a of the press ring 60. Thereafter, the pressing rods 116 are lowered to press the movable holding member 58 downward, thereby collapsing the sealing members 62, 68 so that the movable holding member 58 will not rotate. The rotating pins 112 are then rotated to thereby rotate the press ring 60, whereby each of outwardly protruding portions of the press ring 60 is slipped into each of the clampers 74 to lock the movable holding member 58.

By thus first lowering the pressing rods 116 so as to inhibit rotation of the movable holding member 58 and then rotating the press ring 60 via the rotating pins 112, the press ring 60 can be rotated with low friction. This reduces wear of the press ring 60, the clampers 74 and the movable holding member 58, and prevents the movable holding member 58 from co-rotating with the press ring 60, thereby preventing a displacement of the movable holding member 58 which would affect centering of the substrate W and distort the sealing members 62, 68 to lower their sealing abilities.

It is possible to use a ring-shaped rotator instead of the rotary plate 114. Further, instead of the pressing rods 116, it is possible to use a cylindrical pressing member 116a as shown by the shaded area of FIG. 9 so that an entire peripheral edge area of the substrate support 58b of the movable holding member 58 can be pressed evenly.

A single locking/unlocking mechanism 110 is provided. After locking (or unlocking) one of two substrate holders 18 placed on the loading plate 52, the loading plate 52 is slid laterally to lock (or unlock) the other substrate holder 18 with the locking/unlocking mechanism 110. The substrate holder 18 is provided with a sensor for inspecting a state of contact between the substrate W and the contacts of the substrate holder 18 when the substrate is held by the substrate holder 18. A signal from the sensor is inputted to a controller (not shown).

To one end of the fixed holding member 54 of the substrate holder 18 is jointed a pair of substantially T-shaped hands 120 which serves as a support when the substrate holder 18 is transported or held in a hung state. In the stocker 24, the holder 18 is held in a vertically hung state with protruding end portions of the hands 120 put on an upper surface of a circumferential wall of the stocker 24. The hands 120 of this thus hung substrate holder 18 are grasped by the transporter 42 of the substrate transport device 40 when transporting the substrate holder 18. Also in the pre-wetting tank 26, the presoaking tank 28, the water-washing tanks 30a, 30b, the blow tank 32 and the plating tank 34, the substrate holder 18 is held in a hung state with the hands 120 on a upper surface of a circumferential wall of each tank.

Figure 27A:
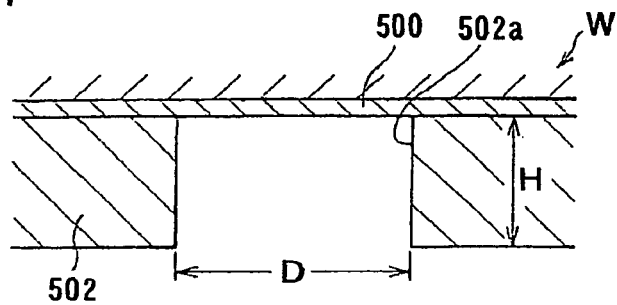
FIGS. 27A through 27D are diagrams illustrating, in a sequence of process steps, formation of bumps (protruding electrodes) on a substrate.

Next, a plating process will be described for plating a series of bump electrodes using the plating apparatus described above. As shown in FIG. 27A, a seed layer 500 as an electric feed layer is formed on a surface of a substrate. A resist 502 having a height H of e.g. 20-120 µm is applied over an entire surface of the seed layer 500. Subsequently, an opening 502a having a diameter D of e.g. 20-200 µm is formed at a prescribed position in the resist 502. Such a substrate W is housed in the cassette 10 with a surface (surface to be plated) facing upward. The cassette 10 is loaded onto the cassette table 12.

The substrate transfer device 22 takes out one substrate from the cassette 10 on the cassette table 12 and places the substrate on the aligner 14. The aligner 14 aligns an orientation flat or notch or the like in a prescribed orientation. Next, the substrate transfer device 22 transfers this aligned substrate W to the substrate attaching/detaching section 20.

In the substrate attaching/detaching section 20, two substrate holders 18 housed in the stocker 24 are gripped simultaneously by the transporter 42 of the substrate holder transport device 40, and transported to the substrate attaching/detaching section 20. The substrate holders 18 are lowered in a horizontal state, and placed on the loading plate of the substrate attaching/detaching section 20 simultaneously. The cylinders are operated to open the moveable supporting members 58 of the substrate holders 18.

While the moveable supporting members 58 are open, the substrate transfer device 22 inserts the substrate into one of the substrate holders 18 positioned in a center of the substrate attaching/detaching section 20. The cylinder performs a reverse operation to close the moveable supporting member 58. Subsequently, the moveable supporting member 58 is locked by the locking/unlocking mechanism 110. After one substrate W is loaded into one substrate holder 18, the loading plate 52 is slid horizontally to load another substrate in the other substrate holder 18. Subsequently, the loading plate 52 is returned to its original position.

Thus, each surface of the substrate to be plated is exposed in the opening portion of the substrate holder 18. The sealing members 62, 68 seal the peripheral portion of the substrates W to prevent plating solution from entering thereinto. Electricity is continued through the plurality of contacts in areas not in contact with the plating solution. Wiring is connected from the contacts to the hands 120 of the substrate holder 18. By connecting a power source to the hands 120, electricity can be supplied to the seed layer 500 formed on the substrate.

Next, the transporter 42 of the substrate holder transport device 40 grips both of the substrate holders 18 holding the substrate simultaneously, and transports the substrate holders 18 to the stocker 24. The substrate holders 18 are lowered with horizontal state so that two substrate holders 18 are suspended (temporary placement) in the stocker 24.

The above process performed by the substrate transfer device 22, the substrate attaching/detaching section 20, and the transporter 42 of the substrate holder transport device 40 is repeated in order to load substrate W one after another into the substrate holder 18 housed in the stocker 24 and suspend (temporary placement) the substrate holder 18 one after another at prescribed positions in the stocker 24.

When the sensor mounted on the substrate holder 18 for inspecting a contact state between the substrate and the contacts determines a poor contact, the sensor inputs a signal into a controller (not shown).

Meanwhile, the other transporter 44 of the substrate transport device 40 simultaneously grips two substrate holders 18 that have been holding the substrates and temporarily placed in the stocker 24. The transporter 44 transports the substrate holders 18 to the pre-wetting tank 26 and lowers to enter the substrate holders 18 into the pre-wetting tank 26.

However, if the sensor mounted on the substrate holder 18 for inspecting the contact state between the substrate and contacts has detected a poor contact state, the substrate holder 18 holding the substrate having the poor contact is left stored in the stocker 24. Accordingly, when a poor contact between a substrate and the contacts of the substrate holder 18 occurs, it does not halt the apparatus, but allows plating operations to continue. The substrate with a poor contact is not subjected to a plating process. Instead the substrate is returned to a cassette and discharged from the cassette.

Next, the substrate holders 18 holding the substrates are transported in the same way as described above to the presoaking tank 28 and oxide layers of the substrates are etched away in the presoaking tank 28 to expose a clean metal surface. Next, the substrate holders 18 holding the substrates are transported in the same way to the cleaning tank 30a, wherein the surfaces of the substrates are cleaned by pure water held therein.

After the cleaning process, the substrate holders 18 holding the substrates are transported in the same way as described above to the plating tank 34 and suspended in the plating units 38. The transporter 44 of the substrate holder transport device 40 repeatedly performs this operation of transporting the substrate holder 18 to the plating unit 38 and suspending the substrate holder 18 at a prescribed position therein.

When all the substrate holders 18 are suspended in the plating units 38, plating voltages are applied between anodes (not shown) and the substrates, while plating solution in the overflow tank 36 is circulating and overflowing into the overflow tank 36. At the same time, the paddle drive devices 46 reciprocate the paddles in a direction parallel to surfaces of the substrates, thereby plating the surfaces of the substrates. At this time, each of the substrate holders 18 is fixed in a suspended state by the hands 120 at a top of the plating unit 38. Electricity is supplied from a plating power source to the seed layer 500 (see FIGS. 27A to 27C) via the conductors 86 and the electrical contacts 88.

After completion of this plating process, application of plating voltages, supply of plating solution, and reciprocation of the paddles are all stopped. The transporter 44 of the substrate holder transport device 40 grips two of the substrate holders 18 holding the substrates simultaneously, and transports the substrate holders 18 to the cleaning tank 30b, as described above. The substrate holders 18 are immersed in pure water held in the cleaning tank 30b to clean surfaces of the substrates W. Subsequently, the substrate holders 18 are transferred as described above to the blowing tank 32, where air is blown onto the substrate holders 18 holding the substrates to remove water droplets deposited thereon. Next, the substrate holders 18 are returned and suspended at prescribed positions in the stocker 24, as described above.

The above operation of the transporter 44 of the substrate holder transport device 40 is repeatedly conducted. After each substrate W has been subjected to this complete plating process, the substrate holders 18 are returned to the prescribed suspended position in the stocker 24.

Meanwhile, the transporter 42 of the substrate holder transport device 40 simultaneously grips two of the substrate holders 18 holding the substrates that have been returned to the stocker 24 after the plating process, and places the substrate holders 18 on the loading plate 52 of the substrate attaching/detaching section 20, as described above. At this time, a substrate for which a poor connection was detected by the sensor mounted on the substrate holders 18 for inspecting a contact state between the substrate and contacts, and which was left in the stocker 24, is also transported to the loading plate 52.

Next, the moveable supporting member 58 in the substrate holder 18 positioned at the center of the substrate attaching/detaching section 20 is unlocked by the locking/unlocking mechanism 110. The cylinder is operated to open the moveable supporting member 58. At this time, as described above, the substrate W can be prevented from sticking to the moveable supporting member 58 when the moveable supporting member 58 is opened. In this state, the substrate transfer device 22 takes a plating processed substrate out of the substrate holder 18 and transfers the substrate to the spin dryer 16. The spin dryer 16 spins the substrate at a high rotational speed for spin-drying (draining). The substrate transfer device 22 then transfers the substrate back to the cassette 10.

After the substrate is returned to the cassette 10, or during this process, the loading plate 52 is slid laterally, and the same process is performed for a substrate mounted in the other substrate holder 18 so that this substrate is spin-dried and returned to the cassette 10.

The loading plate 52 is returned to its original position. Next, the transporter 42 simultaneously grips two of the substrate holders 18 which now hold no substrates, and return the substrate holders 18 to the prescribed position in the stocker 24, as described above. Subsequently, the transporter 42 of the substrate holder transport device 40 grips two of the substrate holders 18 holding substrates that have been returned to the stocker 24 after the plating process, and transports the substrate holders 18 onto the loading plate 52, as described above. The same process is repeated.

Figure 27B:
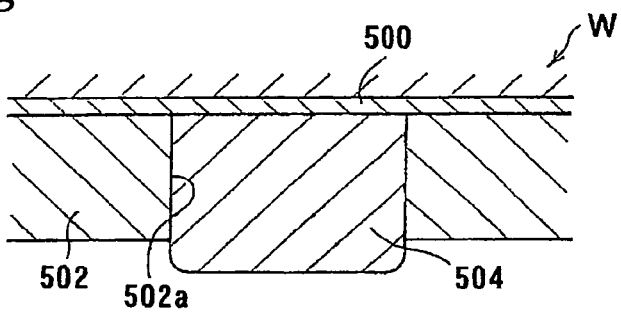

The process is completed when all substrates have been taken out of the substrate holders, which have been holding substrates after the plating process and returned to the stocker 24, spin-dried and returned to the cassette 10. This process provides substrates W that have a plated film 504 grown in the opening 502a formed in the resist 502, as shown in FIG. 27B.

Figure 27C:
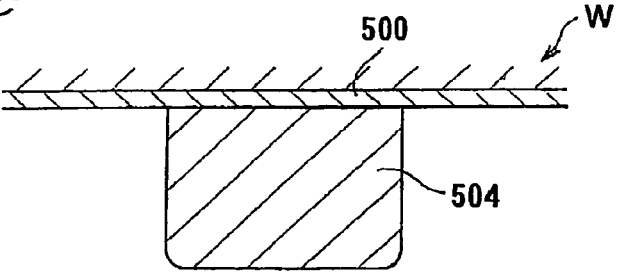
Figure 27D:
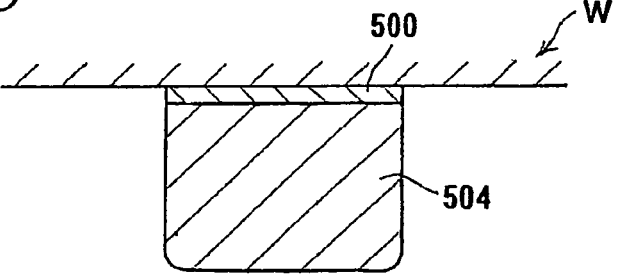

The substrate W which has been spin dried, as described above, is immersed in a solvent, such as acetone, that is maintained at a temperature of 50-60° C., for example. In this process, the resist 502 is peeled off from the surface of the substrate W, as shown in FIG. 27C. Next, an unnecessary portion of the seed layer 500 exposed after the plating process is removed, as shown in FIG. 27D, for thereby forming the bump.

In this example, the stocker 24 for housing the substrate holders 18 in a vertical position is provided between the substrate attaching/detaching unit 20 and plating units 38. The first transporter 42 of the substrate holder transport device 40 transports the substrate holders 18 between the substrate attaching/detaching unit 20 and stocker 24, and the second transporter 44 of the substrate holder transport device 40 transports the substrate holders 18 between the stocker 24 and plating units 38, respectively. Unused substrate holders 18 are stored in the stocker 24. This is designed to improve throughput by providing smooth transporting of the substrate holders 18 on either side of the stocker 24. However, it is of course possible to use one transporter to perform all transporting operations.

Further, a robot having a dry hand and a wet hand may be employed as the substrate transfer device 22. The wet hand is used only when taking out plating-processed substrates from the substrate holders 18. The dry hand is used for all other operations. In principle, the wet hand is not necessarily required since a backside of the substrate does not contact with plating solution due to the seal of the substrate holder 18. However, by using the two hands in this manner, it is possible to prevent a possible contamination with plating solution due to poor sealing or invasion to the backside of rinse water, from contaminating the backside of a new substrate.

Figure 10A:
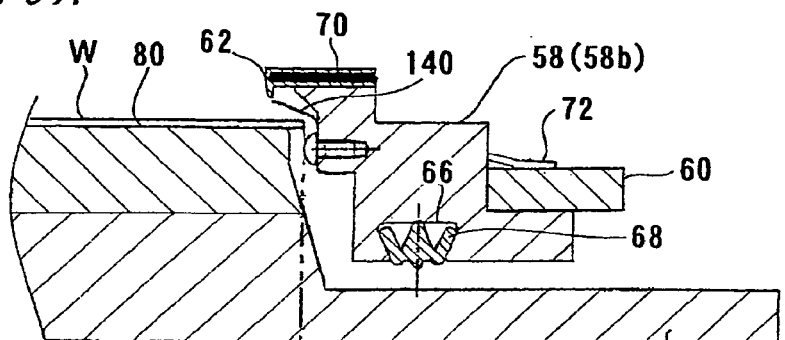
FIGS. 10A through 10C are diagrams illustrating a relationship between a leaf spring member and a substrate in the course of holding of the substrate by the substrate holder.
Figure 10B:
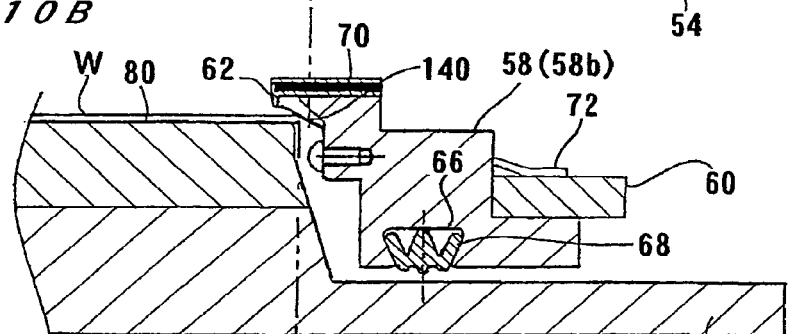
Figure 10C:
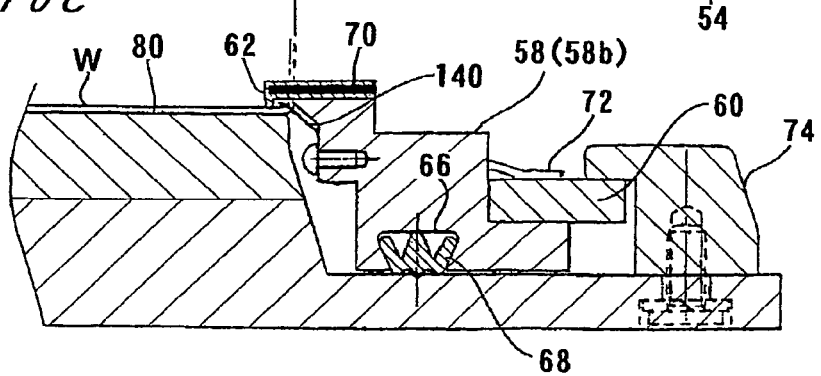

According to the substrate holder 18 of the above-described embodiment, such electrical contacts are employed as the electrical contacts 88 that have a positioning (centering) function for the substrate W, and a function of preventing the substrate W from sticking to the sealing portion 62a of the inner sealing member 62 and being brought up along with the sealing portion 62a when taking the substrate W after plating out of the substrate holder 18. Structure of the substrate holder 18 can be simplified by use of such electrical contacts 88. Besides electrical contacts, as shown in FIGS. 10A to 10C, it is also possible to provide the movable holding member 58 with leaf spring members 140 having a positioning (centering) function for the substrate W, and a function of preventing the substrate W from sticking to the sealing portion 62a of the inner sealing member 62 and being brought up along with the sealing portion 62a when taking the substrate W after plating out of the substrate holder 18. The leaf spring member 140 may be disposed, for example, at each location between two adjacent electrical contacts 88. This operation of leaf spring members 140 is substantially the same as that of the above-described electrical contacts 88 shown in FIGS. 5A to 5C, and hence a description thereof is here omitted.

Since the substrate W is biased inwardly by an elastic force of the leaf spring members 140, positioning (centering) of the substrate W relative to the substrate holder 18 upon holding of the substrate by the substrate holder 18 can be effected by the leaf spring members 140. Further, by providing the movable holding member 58 with the sealing member 62, the electrical contacts and the leaf spring members 140, and effecting positioning of the substrate W by the leaf spring members 140, it becomes possible to make a positional relationship between the substrate W, the sealing member 62 and the electrical contacts always constant when the substrate W is held by the substrate holder 18.

In this regard, a precise centering can be effected with difficulty only through engagement between the above-described tapered portions 82a, 90. This is because a clearance, if small, is necessary between the two tapered portions 82a, 90 in order to facilitate the engagement therebetween. Accordingly, the center of the substrate inevitably deviates from the center of the movable holding member 58 by the clearance. In view of this, the movable holding member 58 is provided with the plurality of leaf spring members 140 so that they make elastic contact with the peripheral edge of the substrate W and evenly apply a pressing force acting to move the substrate W toward the center of the movable member 58. Accordingly, when the movable holding member 58 engages the fixed holding member 54, the substrate W is shifted so that the center of the substrate can coincide exactly with the center of the movable holding member 58.

Though in the above-described embodiment each leaf spring member 140 is comprised of a single plate formed in the shape of a leaf spring, the leaf spring member 140 may be comprised of a leaf spring-shaped laminate of two or more plates, for example, a laminated leaf spring 124 consisting of plates 122a, 122b shown in FIG. 11.

Such leaf spring members 140 (laminated leaf springs 124) can secure a long stroke without plastic deformation and can be set in a considerably small space. Positioning (centering) of the substrate W with respect to the substrate holder 18 can be effected by the leaf spring members 140 (laminated leaf springs 124) in the course of holding the substrate W by the substrate holder 18. Further, when the substrate W after plating is taken out the substrate holder 18, the laminated leaf springs 124 can prevent the substrate W from sticking to the sealing portion 62a of the inner sealing member 62 and being brought up along with the inner sealing member 62.

Further, as shown in FIGS. 12 through 14, it is possible to use as the inner sealing member 62 a multi-seal structure 128 comprising two ring-shaped sealing portions 126a, 126b on both sides in a width direction, and partition sealing portions 126c extending in the width direction and provided at certain locations along a circumferential direction. By sealing a peripheral portion of the substrate W with the sealing member 62 comprised of the multi-seal structure 128, a sealing width is substantially widened, so that a more complete sealing can be attained even when centering of the substrate is not perfect. Further, by sealing certain portions along a circumferential direction of the inner sealing member 62 with the partition sealing portions 126c in the width direction, it becomes possible to maintain a sealing ability of the inner sealing member 62 even when it is damaged.

Figure 13A:
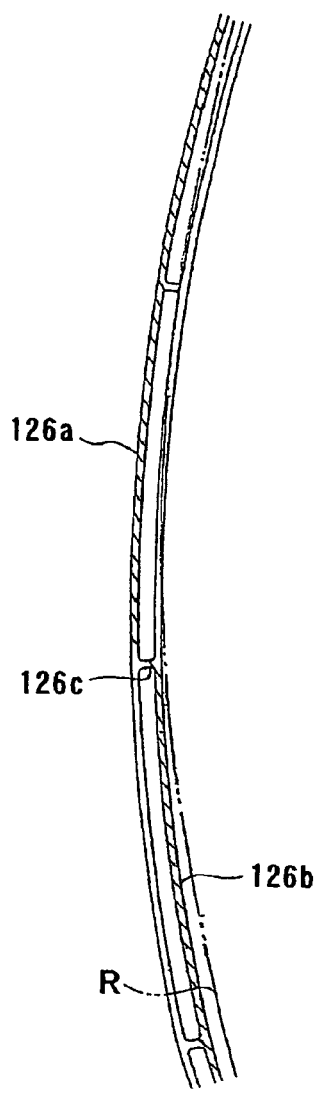
FIGS. 13A and 13B are enlarged views of portion A of FIG. 12.
Figure 13B:
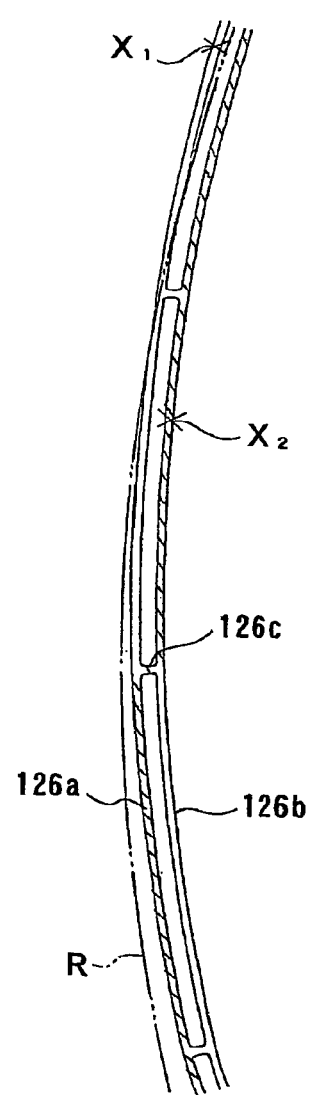

In particular, as shown in FIGS. 13A and 13B, due to a deviation in centering of the substrate W, there may be a case where the sealing portion 126b, positioned on an inner side of the multi-seal structure 128, crosses over a resist line R having a step on a surface of the substrate (FIG. 13A), or a case where the sealing portion 126a, positioned on an outer side of the multi-seal structure 128, crosses over the resist line R (FIG. 13B). Even in such cases, at least one of the sealing portions 126a, 126b, not crossing over the resist line R, constitutes a sealing line, as shown by shaded lines in FIGS. 13A, 13B, whereby sealing is ensured if a liquid leak occurs at a crossing portion. Further, if the sealing portions 126a, 126b are damaged, for example at sites $X_1$ and $X_2$ close to each other and on both sides of the partition sealing portion 126c as shown in FIG. 13B, a sealing ability can be maintained with the partition sealing portion 126c positioned between damaged sites $X_1$ and $X_2$.

FIG. 15 shows a substrate holder according to another embodiment of the present invention. The substrate holder of this embodiment differs from the above-described substrate holder in that on the movable holding member 58 side surface of the fixed holder member 54 is provided a pair of conducting lines (conductors) 130 for detecting a liquid leak which, when a plating solution leaks to a back surface side of the substrate W held by the movable holding member 58 and the fixed holding member 54, short-circuits via this leaked plating solution. The pair of conducting lines 130 extends continuously and circumferentially on a surface of the fixed holding member 54 such that it extends over almost an entire peripheral back surface of the substrate W. Further, the pair of conducting line 130 is open at one end, and at the other end is connected to an electric resistance measuring device 132. Other construction is the same as the above-described substrate holder.

According to this embodiment, occurrence of a liquid leak can be detected quickly and securely by measuring electric resistance between the pair of conducting lines 130 by the electric resistance measuring device 132. Thus, the pair of conducting lines 130 is open at one end, and therefore an electric current usually does not flow. However, when a leak of plating solution occurs, the plating solution, which is a conductor, short-circuits the pair of conducting lines 130 whereby an electric current flows through the conducting lines 130. That is, the plating solution behaves like a resistance R, as illustrated by imaginary lines in FIG. 15, which short-circuits the pair of conducting lines 130. Accordingly, measurement of the electric resistance via the electric current can detect leakage of plating solution.

According to this embodiment, the pair of conducting lines (conductors) is disposed such that it extends continuously over the entire peripheral back surface of the substrate. By thus disposing the pair of conducting lines right inside the peripheral sealing portion of the substrate, it becomes possible to immediately detect a leak wherever the leak occurs. Alternatively, unlike this embodiment, it is also possible to provide a pair of conducting lines at any location, for example, a location where a leaked liquid is likely to collect, or provide a plurality of pairs of conducting lines in parallel.

Figure 16:
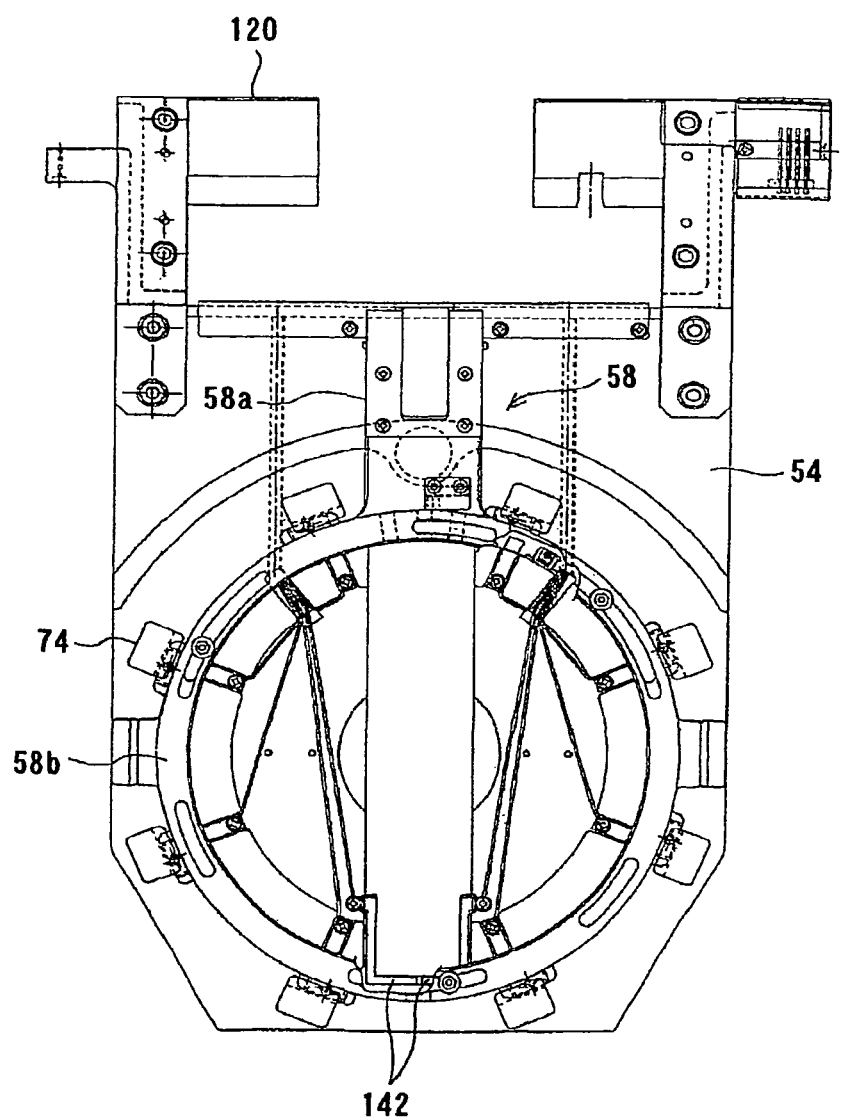
FIG. 16 is a plan view of a substrate holder according to yet another embodiment of the present invention.

For instance, as shown in FIG. 16, a pair of conductive plates (conductors) 142, connected to a pair of electrodes respectively, may be disposed opposite to each other at a predetermined spacing at a bottom portion of the fixed holding member 54 where plating solution accumulates in case leakage of the solution occurs. An electric current flows between the conductive plates 142 via the plating solution when the solution accumulates at the bottom portion of the fixed holding member 54 after occurrence of this leak. According to this embodiment, by disposing the conductive plates 142 at such a local location as the bottom portion of the fixed holding member 54, a liquid leak over an entire area of the substrate holder 18 can be detected.

As described hereinabove, according to the plating apparatus of the present invention, by simply setting a cassette housing substrates on the cassette table and activating the apparatus, electroplating employing a dipping method can be performed fully automatically to form a plated metal film suited for formation of bumps.

Further, according to the present invention, a suction pad for attracting the back surface of the substrate, held by the fixed holding member and the movable holding member, may be mounted to the fixed holding member. Since the back surface of the substrate is kept attracted to the suction pad, when the movable holding member is moved after plating to release holding of the substrate and take the substrate out of the substrate holder, the substrate can be prevented from sticking to the inner sealing member and moving along with the inner sealing member. The substrate can thus be taken out of the substrate holder in a stable manner.

Further, since the inner sealing member for sealing a peripheral portion of the substrate may be integrally mounted on a holding member for holding the inner sealing member, when the movable holding member is moved after plating to release holding of the substrate and the substrate is taken out of the substrate holder, the sealing portion of the inner sealing member can be prevented from adhering to the substrate, and hence the inner sealing member can be prevented from being torn off from the holding member. Releasability of the inner sealing member from the substrate can thus be improved.

Further, the outer sealing member for sealing between the movable holding member and the fixed holding member may be one that has a W-shaped cross-section, which easily collapses when pressed in the width direction and recovers by elastic force when a pressing force is released. Use of such an outer sealing member can facilitate its insertion into the seal groove, e.g. in a dovetail shape, and prevent it from falling from the seal groove.

Further, a leaf spring member may be mounted on the movable holding member so that the substrate is biased toward the fixed moving member when holding of the substrate between the moveable holding member and the fixed holding member is released. Accordingly, when the movable member is moved after plating to release the holding of the substrate and take the substrate out of the substrate holder, movement of the substrate is restricted and the inner sealing member mounted on the movable holding member is detached from the substrate, whereby the substrate can be prevented from sticking to the inner sealing member and moving along with the inner sealing member.

Furthermore, the movable holding member may be provided with at least one pair of conductors for detecting a liquid leak which, when a plating solution leaks to a back surface side of a substrate held by the movable holding member and the fixed holding member, short-circuits via this leaked plating solution.

This enables an immediate detection of occurrence of a liquid leak and makes it possible to deal with the liquid leak promptly, thereby preventing the liquid leak from adversely affecting the apparatus and quality of plating.

FIGS. 17 through 22F show a substrate holder according to still another embodiment of the present invention. This substrate holder has a fixed holding member 154 made of, for example, a vinyl chloride resin in the form of a rectangular flat plate, and a movable holding member 158 mounted openably and closably via a hinge 156 on the fixed holding member 154. While the movable holding member 158 is shown as being openably and closably mounted on the fixed holding member 154 by the hinge 156 in present embodiment, the movable holding member 158 may be disposed in a position facing the fixed holding member 154 and may be moved forward to the fixed holding member 154 so as to be opened and closed with respect thereto.

The movable holding member 158 has a base portion 158a and a ring-shaped support portion 158b, and is made of, for example, a vinyl chloride resin for better slippage against a below-described press ring 162. A ring-shaped sealing member (seal ring) 160 that is of a substantially channel-shaped transverse cross section having two lips, one being longer than the other, is mounted on a surface of the support portion 158b which faces the fixed holding member 154, with the ring-shaped sealing member 160 being open toward the fixed holding member 154.

The press ring 162 is rotatably supported on a surface of the support portion 158b on a far side from the fixed holding member 154, and slide plates 164 are jointed to outer circumferential surfaces of the press ring 162. The press ring 162 is made of, for example, titanium that is highly resistant to corrosion in oxidizing environments and has sufficient rigidity.

Inverted L-shaped clampers 170, each having an inward protrusion, are vertically mounted on the fixed holding member 154 at circumferentially equal spaced intervals in positions laterally outward of the slide plates 164. Surfaces of the slide plates 164, and lower surfaces of the inward protrusions of the clampers 170, which are positioned in covering relation to the surfaces of the slide plates 164, are tapered so as to be slanted oppositely to each other in a rotational direction. Projections 173, which comprise rotary pins threaded into the press ring 162, for example, are mounted on a surface of the press ring 162 respectively in a plurality of locations (e.g., four locations) along a circumferential direction of the press ring 162. The projections 173 are engaged by a rotating mechanism (locking/unlocking mechanism) for rotating the press ring 162 in unison with the slide plates 164.

When the movable holding member 158 is open, substrate W is inserted into a center of the fixed holding member 154. After the movable holding member 158 is closed about the hinge 156, the press ring 162 is turned clockwise to cause the slide plates 164 to slide into the protrusions of the clampers 170, thereby fastening and locking the fixed holding member 154 and the movable holding member 158 to each other through their tapered surfaces. By turning the press ring 162 counterclockwise, the slide plates 164 are removed from the protrusions of the L-shaped clampers 170, thereby unlocking the fixed holding member 154 and the movable holding member 158 from each other. When the movable holding member 158 is locked, a shorter lip 160a on an inner circumferential surface of the sealing member 160 is in pressure contact with a surface of the substrate W, and a longer lip 160b on an outer circumferential surface of the sealing member 160 is in pressure contact with a surface of the fixed holding member 154, respectively. The sealing member 160 is thus uniformly pressed against the substrate W and the fixed holding member 154 to seal the surface of the substrate W and the surface of the fixed holding member 154 reliably.

A ridge 182 is mounted centrally on and projects from the fixed holding member 154 in a ring shape matching a size of the substrate W. The ridge 182 provides a support surface 180 for abutting a peripheral edge of the substrate W to support the substrate W thereon. The ridge 182 has a plurality of recesses 184 defined therein at predetermined positions along a circumferential direction thereof.

Figure 17:
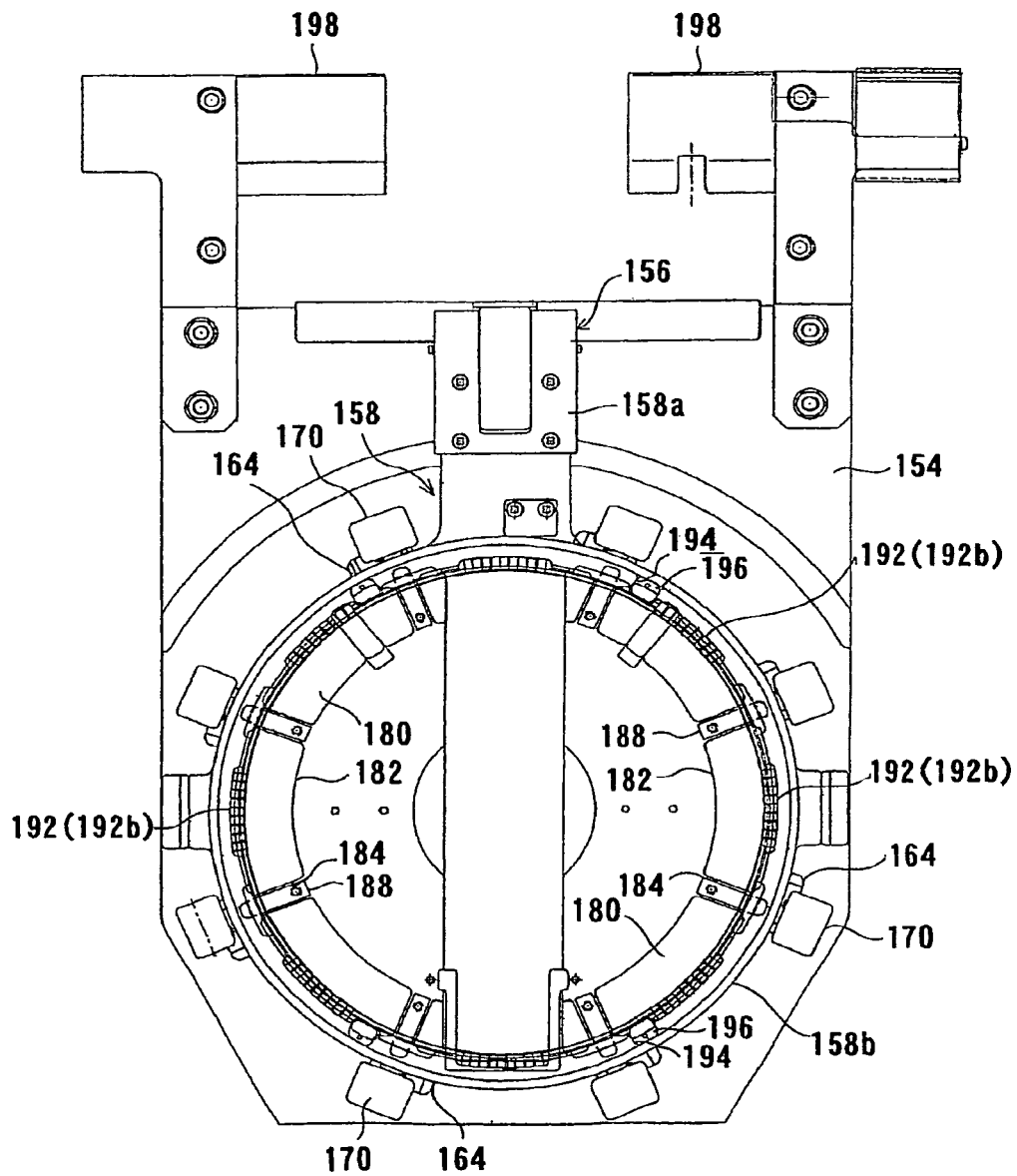
FIG. 17 is a plan view of a substrate holder according to yet another embodiment of the present invention.
Figure 18:
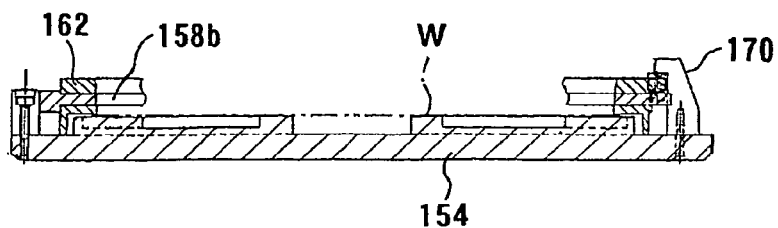
FIG. 18 is a vertical sectional front view of the substrate holder shown in FIG. 17.
Figure 20A:
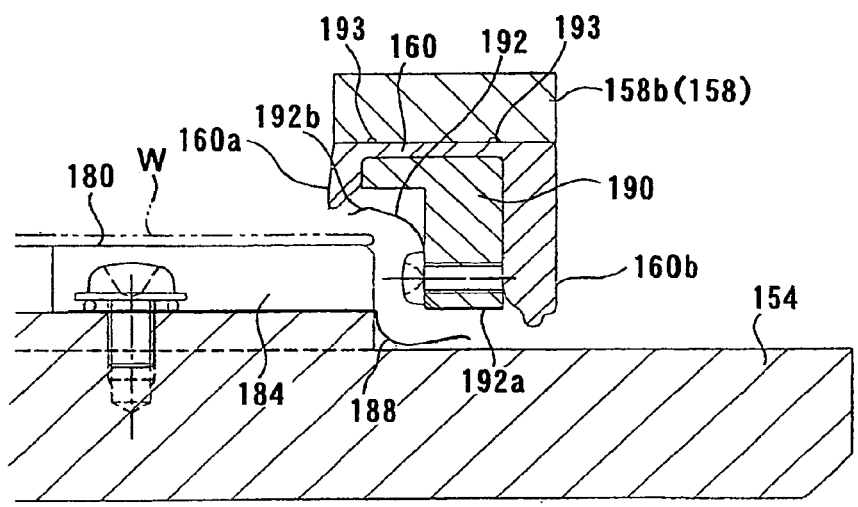
FIG. 20A is a cross-sectional view showing a conductor and an electrical contact of the substrate holder shown in FIG. 17 before holding of a substrate.
Figure 20B:
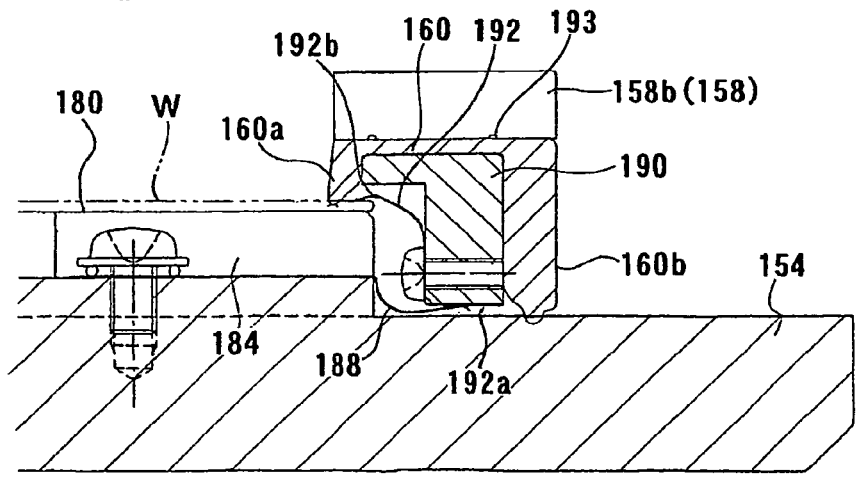
FIG. 20B is a cross-sectional view showing the conductor and the electrical contact of the substrate holder shown in FIG. 17 after holding of a substrate.

As shown in FIGS. 17, 20A and 20B, a plurality of (eight in the illustrated embodiment) conductors (electrical contacts) 188 are disposed respectively in the recesses 184 and connected to respective wires extending from external contacts on a below-described hand 198. When the substrate W is placed on the support surface 180 of the fixed holding member 154, the conductors 188 have their springy ends exposed on the surface of the fixed holding member 154 laterally of the substrate W.

A support body 190 is mounted in an inner space of the sealing member 160 which is defined between the lips 160a, 160b. Electrical contacts 192 have respective legs 192a fixed to the support body 190 at positions confronting the conductors 188. Each electrical contact 192 is formed in a leaf springs shape. Specifically, the electrical contacts 192 have contact ends 192b projecting inwardly as leaf springs that can easily flex under their own resiliency.

Figure 26A:
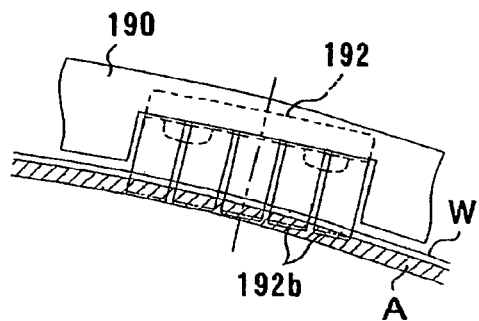
FIGS. 26A through 26D are plan views showing different electrical contacts, respectively.

As shown in FIG. 26A, the contact ends 192b are arranged as a plurality of parallel rectangular strips projecting equal lengths toward the substrate W. The electrical contacts 192 are attached to the support body 190 such that a line interconnecting tips of the contact ends (strips) 192b is slightly inclined relative to a tangential direction of the substrate W. As shown in FIG. 26A, therefore, the tips of the contact ends (strips) 192b are held in contact with a contact area A, shown hatched, on the surface of the substrate W in respective different positions in a transverse direction of the contact area A. Even if the substrate W suffers a slight positioning error, at least some of the tips of the contact ends (strips) 192b are brought into contact with the substrate W in the contact area A thereof.

Figure 26B:
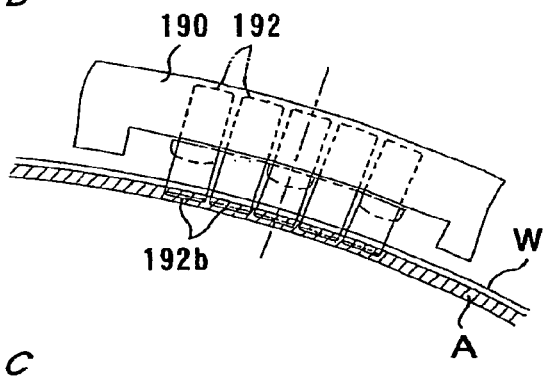

Alternatively, as shown in FIG. 26B, a plurality of elongated electrical contacts 192 may be disposed at predetermined spaced intervals across a diametrical direction of the substrate W, and may have respective contact ends 192b having respective tips held in contact with a contact area A, shown hatched, on the surface of the substrate W in respective positions along a circumferential direction of the contact area A. With this arrangement, even if dirt or the like is attached to the contact ends 192b of some of the electrical contacts 192, the other electrical contacts 192 are kept electrically connected to the substrate W.

Figure 26C:
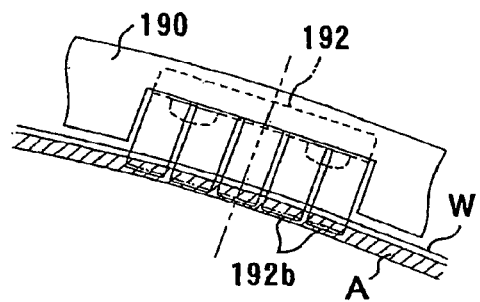
Figure 26D:
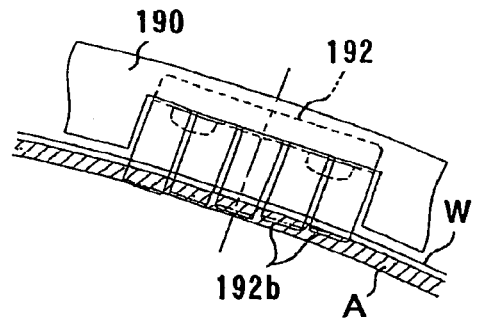

Further alternatively, as shown in FIG. 26C, the electrical contacts 192 may be attached to the support body 190 such that a line interconnecting the tips of the contact ends (strips) 192b, which are arranged as a plurality of parallel rectangular strips projecting equal lengths toward the substrate W, extends parallel to a tangential direction of the substrate W. Still further alternatively, as shown in FIG. 26D, the contact ends (strips) 192b, which are arranged as a plurality of parallel rectangular strips, may project respective different lengths toward the substrate W. With these modifications, the tips of the contact ends (strips) 192b are held in contact with the contact area A, shown hatched, on the surface of the substrate W in respective different positions in the transverse direction of the contact area A. Even if the substrate W suffers a slight positioning error, at least some of the tips of the contact ends (strips) 192b are brought into contact with the substrate W in the contact area A thereof.

When the movable holding member 158 is locked to hold the substrate W with the fixed holding member 154 and the movable holding member 158, as shown in FIG. 20B, exposed portions of the conductors 188 are resiliently held in contact with and electrically connected to lower surfaces of the legs 192a of the electrical contacts 192 under resiliency of the exposed portions of the conductors 188 in a position sealed by the sealing member 160, i.e., a region sandwiched between the lips 160a, 160b of the sealing member 160. The substrate W is thus resiliently held in contact with the tips of the contact ends 192b of the electrical contacts 192 under resiliency of the contact ends 192b. In this manner, while the substrate W is being sealed by the sealing member 160 and held by the substrate holder, the substrate W can be supplied with electric energy through the electrical contacts 192.

Since the electrical contacts 192 are in the form of leaf springs to hold the tips of the contact ends 192b of the electrical contacts 192 in contact with the substrate W under resiliency of the electrical contacts 192, contact failures are reduced, and the electrical contacts 192 are held in contact with the substrate W in an outer circumferential region thereof, thus increasing an area of the substrate W that can effectively be used as a pattern formation area.

At least the surfaces of the conductors 188 which are to be held against the electrical contacts 192 may preferably be plated with gold or platinum.

Figure 21A:
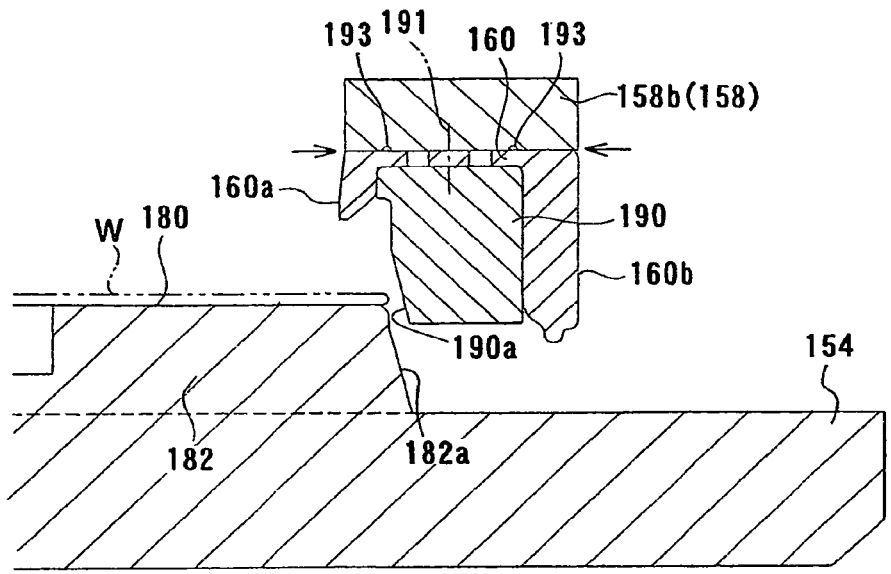
FIG. 21A is a cross-sectional view showing tapered portions of a fixed holding member and a movable holding member of the substrate holder before holding of a substrate.
Figure 21B:
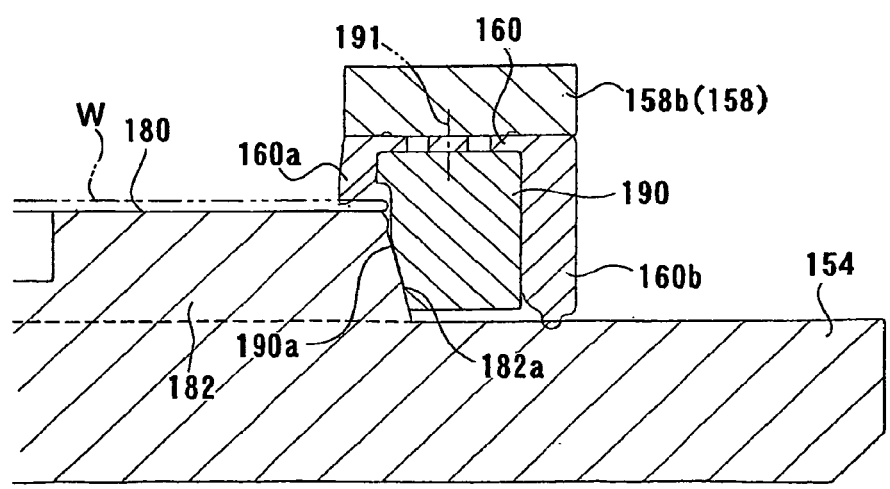
FIG. 21B is a cross-sectional view showing the tapered portions of the fixed holding member and the movable holding member of the substrate holder after holding of a substrate.

As shown in FIGS. 21A and 21B, the ridge 182 of the fixed holding member 154 partly has a tapered portion 182 with a steeple-shaped tapered surface, and an inner circumferential surface of the support body 190 has a tapered portion 190a which complementarily faces the tapered portion 182a. When the fixed holding member 154 and the movable holding member 158 hold the substrate W, the tapered portions 182a, 190a engage each other to position the fixed holding member 154 and the movable holding member 158 in central alignment with each other. Specifically, as shown in FIG. 21B, when the fixed holding member 154 and the movable holding member 158 hold the substrate W, the tapered portions 182a, 190a guide each other, thereby positioning the movable holding member 158 with respect to the fixed holding member 154 or positioning the fixed holding member 154 with respect to the movable holding member 158.

Because of the tapered portions 182a, 190a of the ridge 182 of the fixed holding member 154 and the support body 190 of the movable holding member 158, even if the fixed holding member 154 and the movable holding member 158 are not accurately positionally aligned with respect to each other when they are spaced from each other, they can automatically be positioned aligned with each other by the tapered portions 182a, 190a while the fixed holding member 154 and the movable holding member 158 are in a process of holding the substrate W.

The tapered portion 190a of the support body 190 of the movable holding member 158 serves to guide an outermost circumferential edge of the substrate W supported on the support surface 180 of the ridge 182 of the fixed holding member 154 to position the substrate W, when the fixed holding member 154 and the movable holding member 158 hold the substrate W. Specifically, as shown in FIG. 21B, when the outer circumferential portion of the substrate W projects outwardly from the support surface 180 of the ridge 182, the outermost circumferential edge of the substrate W contacts the tapered portion 190a, thereby positioning (centering) the substrate W with respect to the substrate holder and hence the sealing member 160.

Thus, while the fixed holding member 154 and the movable holding member 158 are in a process of holding the substrate W, they are centrally positioned with respect to each other, and at the same time the tapered portion 190a of the support body 190 of the movable holding member 158 positions (centers) the substrate W with respect to the substrate holder.

Furthermore, as shown in FIGS. 22A to 22F, a plurality of grooves 194 are defined in the surface of the fixed holding member 154 at positions, along the circumferential direction, which face the sealing member 160. Leaf spring members 196 which extend upwardly are disposed respectively in the grooves 194 with their lower ends fixed in position. The leaf spring members 196 are made springy with their lower ends being fixed and upper ends being free. The leaf spring members 196 have springy extensions (free end portions) 196a, which extend outwardly obliquely in an upward direction, and arcuate engaging portions 196b on tip ends of the extensions 196a.

The support body 190 of the movable holding member 158 has, on its inner circumferential surfaces facing the leaf spring members 196, guide surfaces each comprising a tapered surface 190c slanted inwardly in the upward direction and a vertical surface 190d extending vertically contiguously to the tapered surface 190c.

Figure 22A:
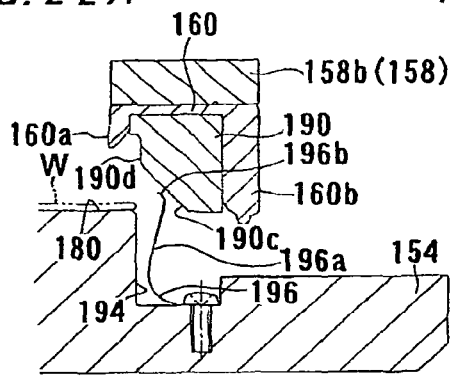
FIGS. 22A through 22F are diagrams illustrating, in a sequence of steps, a relationship between a leaf spring member and a member that engages the leaf spring member to deform the leaf spring member.
Figure 22F:
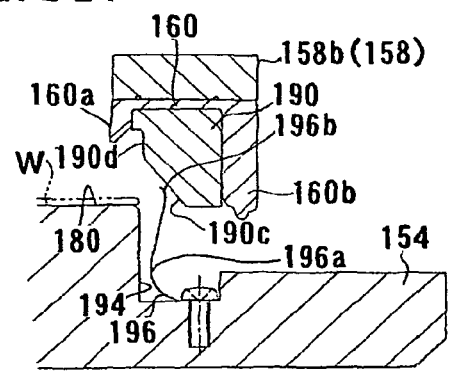
Figure 22B:
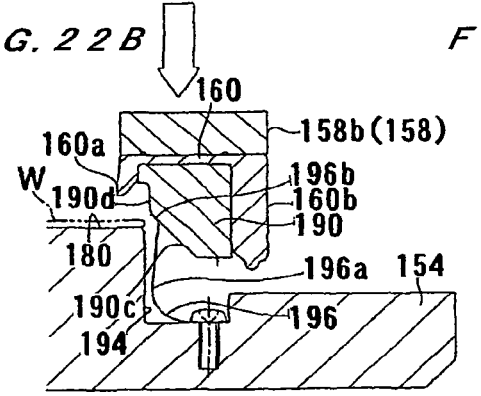
Figure 22E:
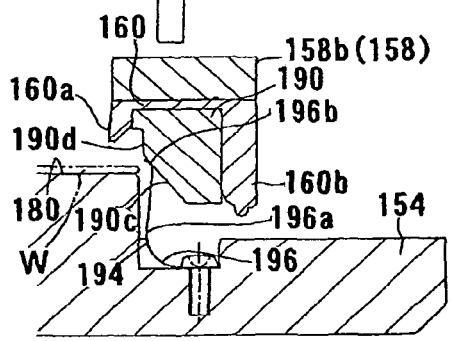
Figure 22C:
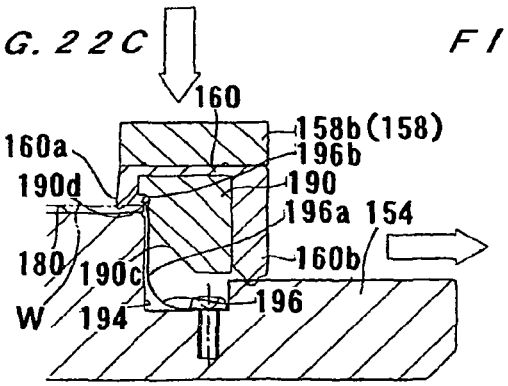

As shown in FIGS. 22A and 22B, as the movable holding member 158 is lowered, the engaging portion 196b on the tip of each leaf spring member 196 is engaged and guided by the tapered surface 190c, thereby causing the leaf spring member 196 to be bent inwardly. Upon further downward movement of the movable holding member 158, as shown in FIG. 22C, the engaging portion 196b on the tip of the leaf spring member 196 is positioned inwardly of the vertical surface 190d, thereby causing the extension 196a to extend vertically, whereupon the leaf spring member 196 will not be bent further inwardly. The engaging portion 196b of the leaf spring member 196 is now positioned over the outer circumferential edge of the substrate W which is supported on the support surface 180 of the fixed holding member 154. Continued descent of the movable holding member 158 presses the shorter lip 160a on the inner circumferential side of the sealing member 160 against the surface of the substrate W and also presses the longer lip 160b on the outer circumferential side of the sealing member 160 against the surface of the fixed holding member 154, respectively, thus uniformly pressing the sealing member 160 to seal the substrate W and the fixed holding member 154 securely. The substrate W is then processed, e.g., plated.

Figure 22D:
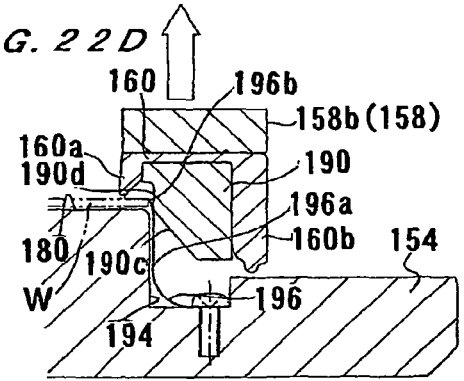

After a series of processing of the substrate W is finished, the movable holding member 158 is elevated to remove the substrate W which has been held by the substrate holder. At this time, as shown in FIG. 22D, since the engaging portion 196b on the tip of the leaf spring member 196 is positioned inwardly of the vertical surface 190d, the leaf spring member 196 is limited in its movement. Consequently, even if the substrate W is sticking to the sealing member 160, the engaging portion 196b on the tip of the leaf spring member 196 engages an upper surface of an outer circumferential surface of the substrate W, thereby preventing the substrate W from ascending. The sealing member 160, the movable holding member 158, and the support body 190 are lifted, thereby forcing the substrate W off the sealing member 160. When the movable holding member 158 is further elevated, as shown in FIG. 22E, the engaging portion 196b on the tip of the leaf spring member 196 spreads progressively outwardly under its own resiliency while in abutment against the tapered surface 190c of the support body 190, until it returns to its original position as shown in FIG. 22F. At this time, the engaging portion 196b of the leaf spring member 196 is positioned outwardly of the outer circumferential portion of the substrate W which is supported on the support surface 180 of the fixed holding member 154. Therefore, a processed substrate W is not prevented from being taken out of the substrate holder by the leaf spring member 196, and a substrate to be processed is not prevented by the leaf spring member 196 from being inserted in place.

Accordingly, after the substrate W has been plated, when the movable holding member 158 is moved to release the substrate W and the substrate W is taken out of the substrate holder, the substrate W is prevented from sticking to and moving with the sealing member 160. Since the free end of the leaf spring member 196 is positioned outwardly of the outer circumferential portion of the substrate W when the movable holding member 158 is thus moved, the substrate W is not prevented from being taken out of the substrate holder.

As described above, the sealing member 160 has the lips 160a, 160b for contacting the circumferential edge of the substrate W and the surface of the fixed holding member 158, respectively, when the substrate W is held by the fixed holding member 158 and the movable holding member 154, and the sealing member 160 is held integrally by the support body 190 which is disposed between the lips 160a, 160b. Specifically, the sealing member 160 has a flat portion joining the lips 160a, 160b and sandwiched between the support portion 158b of the movable holding member 158 and the support body 190. The sealing member 160 is fixed in position by fastening the support portion 158b of the movable holding member 158 and the support body 190 with bolts 91 (see FIGS. 21A and 21B).

Further, on the upper surface of the sealing member 160 is integrally provided a pair of radially spaced sealing portions 193 which makes contact with the lower surface of the support portion 158a of the movable holding member 158. The bolts 191 are disposed between the pair of sealing portions 193, and the sealing member 160 is fixed between the support 190 and the support portion 158a by fastening the bolts 194 to squash the sealing portions 193. This prevents leakage of water from an interstice between the support portion 158a and the sealing member 160, shown by the arrow in FIG. 21A, even when a force is applied to the lip portions 160a, 160b of the sealing member 160 in such a direction (downward direction) that it forces the lip portions 160a, 160b away from the support portion 158b.

Inasmuch as the sealing member 160 is held integrally on the support body 190, when the movable holding member 158 is moved to release the substrate W and the substrate W is taken out of the substrate holder after the substrate W has been plated, the lip (seal) 160a of the sealing member 160 is prevented from sticking to the substrate W and being turned up from the support portion 158b of the fixed holding member 158, thereby improving peelability between the sealing member 160 and the substrate W.

Figure 19:
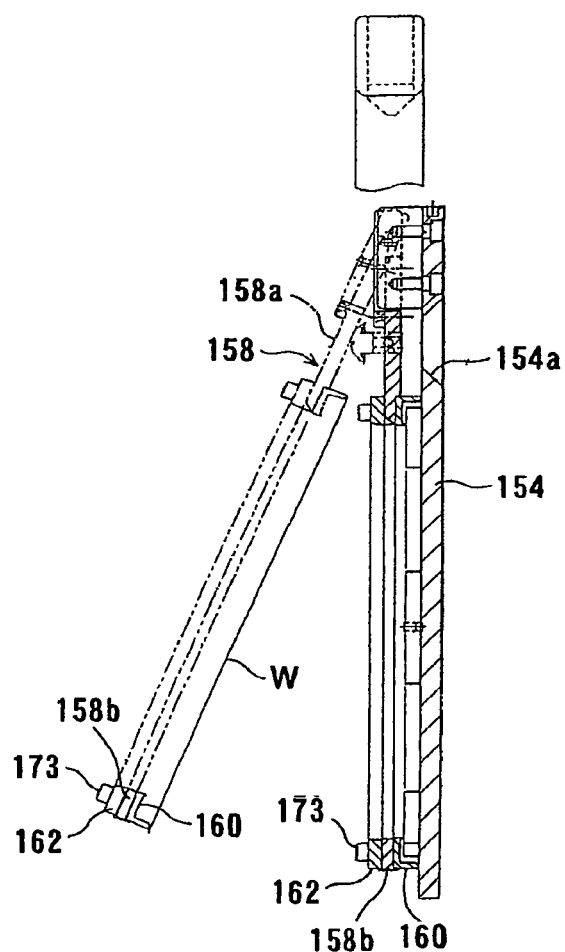
FIG. 19 is a sectional right side view of the substrate holder shown in FIG. 17.

The movable holding member 158 is opened and closed by a cylinder (not shown) and weight of the movable holding member 158 per se. Specifically, the fixed holding member 154 has a through-hole 154a, as shown in FIG. 19, and a cylinder is disposed in a position which confronts the through-hole 154a of the substrate holder placed on a loading plate 152. When the piston rod of the cylinder is extended a pusher rod is caused to lift the base portion 158a of the movable holding member 158 through the through-hole 154a, thereby opening the movable holding member 158. When the piston rod is retracted, the movable holding member 158 is closed under its own weight.

In the present embodiment, the press ring 162 is rotated to lock and unlock the movable holding member 158. A locking/unlocking mechanism for locking and unlocking the movable holding member 158 is mounted on a ceiling side. The locking/unlocking mechanism has gripping members disposed in respective positions aligned with the projections 173 of the press ring 162 of a centrally positioned substrate holder placed on the loading plate 152. The locking/unlocking mechanism is arranged to rotate the press ring 162 when the gripping members are turned about an axis of the press ring 162 with the loading plate 152 being lifted and the projections 173 being gripped by the gripping members. There is a single locking/unlocking mechanism being used, and after the locking/unlocking mechanism locks (or unlocks) one of two substrate holders placed on the loading plate 152, the loading plate 152 is slid horizontally, and the locking/unlocking mechanism locks (or unlocks) the other substrate holder.

The substrate holder has a sensor for inspecting a state of contact between the substrate W and the contacts when the substrate W is held with the substrate holder. A signal from the sensor is supplied to a controller (not shown).

A pair of substantially T-shaped hands 198 is jointed to an end of the fixed holding member 154 of the substrate holder. The hands 198 serve as supports at a time of transporting the substrate holder, and suspending and supporting the substrate holder.

In the above embodiment, the tips of the contact ends 192b of the electrical contacts 192 are resiliently held in contact with the surface of the substrate W that is supported on the support surface 180 of the fixed holding member 154. However, as shown in FIGS. 23A and 23B, when the fixed holding member 154 and the movable holding member 158 hold the substrate W, the contact ends 192b of the electrical contacts 192 may resiliently contact the outer circumferential surface of the substrate W that is supported on the support surface 180 of the fixed holding member 154, so that the electrical contacts 192 serve both as contacts and leaf spring members for positioning the substrate W.

When the substrate holder holds the substrate W, since the substrate W is biased inwardly under resiliency of the electrical contacts 192 in the form of leaf spring members, the electrical contacts (leaf spring members) 192 can effect positioning (centering) of the substrate W with respect to the substrate holder. Because the sealing member 160 and the electrical contacts 192 are provided on the movable holding member 158 and the substrate W is positioned with respect to the substrate holder by the electrical contacts 192, when the substrate W is held by the substrate holder, the substrate W, the sealing member 160, and the electrical contacts 192 are always kept in constant positional relationship relative to each other.

As shown in FIGS. 24A to 24F, electrical contacts/leaf spring members 200 which serve both as the above-described electrical contacts 192 and the above-described leaf spring members 196 may be disposed in recesses 202 defined in the surface of the fixed holding member 154 at predetermined positions along the circumferential directions in facing relation to the sealing member 160.

The electrical contacts/leaf spring members 200 differ in operation from the above-described leaf spring members 196 in that, as shown in FIG. 24C, when an engaging portion 200b on a tip of each electrical contacts/leaf spring member 200 is positioned inwardly of a vertical surface 190d of the support body 190, with an extension 200a extending vertically, thereby preventing the electrical contacts/leaf spring member 200 from being bent further, the electrical contacts/leaf spring member 200 is held in contact with the outer circumferential portion of the substrate W that is supported on the support surface 180 of the fixed holding member 154 to supply the substrate W with electric energy. When the substrate W is to be released, the engaging portion 200b on the tip of the electrical contacts/leaf spring member 200 is continuously held in abutment against the outer circumferential portion of the substrate W, whereby only the sealing member 160 is lifted to force the substrate W off the sealing member 160. Other operational details of the electrical contacts/leaf spring members 200 are the same as the leaf spring members 196 shown in FIGS. 22A to 22F.

With the electrical contacts/leaf spring members 200 which serve both as the electrical contacts 192 and the leaf spring members 196, it is not necessary to provide dedicated leaf spring members for a sole purpose of separating the substrate W from the sealing member when the substrate holder releases the substrate W, and hence the substrate holder can be simplified in terms of structure.

Although not shown, when the fixed holding member 154 and the movable holding member 158 hold the substrate W, the engaging portion 200b on the tip of the electrical contacts/leaf spring member 200 may be resiliently held against the outer circumferential surface of the substrate W that is supported on the support surface 180 of the fixed holding member 154, and when the substrate W is held by the substrate holder, the substrate W may be biased inwardly under resiliency of the electrical contacts/leaf spring member 200, so that the substrate W may be positioned (centered) with respect to the substrate holder by the electrical contacts/leaf spring member 200.

Figure 25A:
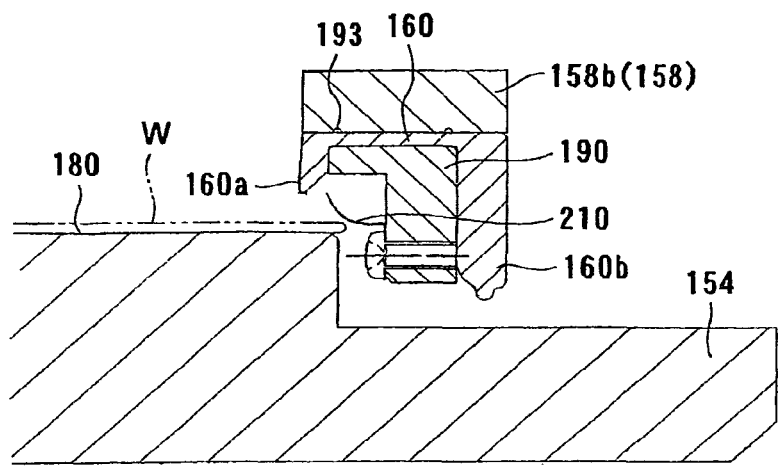
FIG. 25A is a cross-sectional view of a leaf spring member that effects positioning of a substrate before holding of the substrate.
Figure 25B:
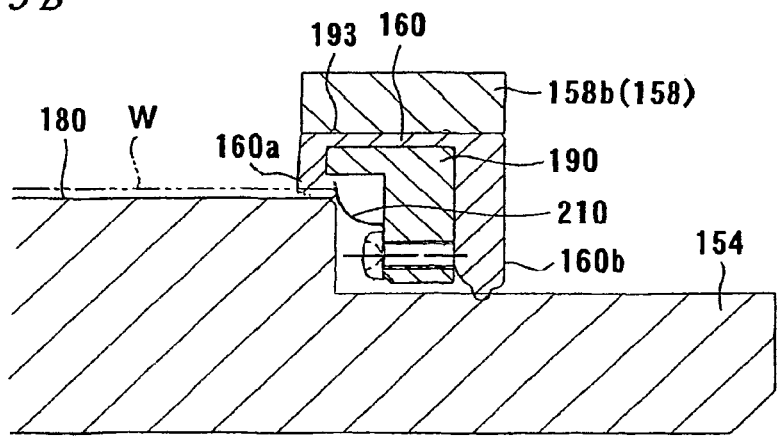
FIG. 25B is a cross-sectional view of a leaf spring member that effects positioning of a substrate after holding of the substrate.

Furthermore, as shown in FIGS. 25A and 25B, a leaf spring member 210 which is springy to be resiliently held against the outer circumferential end of the substrate W to position the substrate W when the fixed holding member 154 and the movable holding member 158 hold the substrate W, may be supported on the support body 190 separately from the electrical contact 192. The leaf spring member 210 may be disposed in a position between two adjacent electrical contacts 192 shown in FIGS. 20A and 20B, for example.

In a process of holding the substrate W with the substrate holder, the substrate W is biased inwardly under resiliency of the leaf spring member 210, and hence positioned (centered) with respect to the substrate holder by the leaf spring member 210. Since the sealing member 160, the electrical contacts 192, and the leaf spring members 210 for positioning the substrate are mounted on the movable holding member 158, and the substrate W is positioned by the leaf spring members 210, when the substrate W is held by the substrate holder, the substrate W, the sealing member 160, and the electrical contacts 192 are always kept in constant positional relationship relative to each other by the leaf spring members 210.

As described above, the plating apparatus according to the present invention performs an electroplating process of a dipping type fully automatically for automatically forming a plated film of metal suitable for bumps, or the like on a surface of a substrate by setting a cassette housing substrates on a cassette table and starting to operate the plating apparatus.

According to the present invention, as described above, since the electrical contacts are constructed as a form of leaf springs and brought into contact with the substrate under their own resiliency, contact failures are reduced, and the electrical contacts are held in contact with the substrate in an outer circumferential region thereof, thus increasing an area of the substrate that can effectively be used as a pattern formation area.

The fixed holding member and the movable holding member have respective tapered portions for engaging each other, thereby positioning them centrally with respect to each other when they hold a substrate. Therefore, in a process of holding the substrate with the fixed holding member and the movable holding member, the fixed holding member and the movable holding member are automatically positioned in central alignment with each other by the tapered portions that engage each other.

Furthermore, the leaf spring member is disposed in a region of the fixed holding member which is sealed by the sealing member when the substrate is held. The leaf spring member has its free end positioned inwardly of the outer circumferential edge of the substrate when the substrate is held with the fixed holding member and the movable holding member, and positioned outwardly of the outer circumferential edge of the substrate when the substrate is released from the fixed holding member and the movable holding member. Therefore, after the substrate has been plated, when the movable holding member is moved to release the substrate and the substrate is taken out of the substrate holder, the substrate is prevented from sticking to and moving with the sealing member, and possibly from being dislodged out of position.

Although certain preferred embodiments of the present invention have been shown and described in detail, it should be understood that various changes and modifications may be made therein without departing from the scope of the appended claims.

INDUSTRIAL APPLICABILITY

The present invention relates to a substrate holder for use in a plating apparatus for forming a plated film in fine interconnect trenches or holes, or resist openings provided in a surface of a semiconductor wafer, or for forming bumps (protruding electrodes), which are to be electrically connected to electrodes, or the like, of a package, on a surface of a semiconductor wafer.

The invention claimed is:

1. A substrate holder for detachably holding a substrate having a surface to be electroplated, said substrate holder comprising:
   a fixed holding member and a movable holding member for holding a substrate therebetween, the movable holding member having a seal portion for sealing an area surrounding a peripheral edge of the substrate when the movable holding member is pressed against the fixed holding member; and
   a springy leaf spring member, mounted to the fixed holding member, which has a free end capable of contacting a surface or the peripheral edge of the substrate when the substrate is held between the movable holding member and the fixed holding member, the free end being located outwardly of the peripheral edge of the substrate when the holding of the substrate between the movable holding member and the fixed holding member is released.

2. The substrate holder according to claim 1, wherein the leaf spring member serves as electrical contact for supplying the substrate with electric energy when the substrate is held between the movable holding member and the fixed holding member.

3. An electroplating apparatus comprising:
   a substrate holder according to claim 1.

* * * * *